US012770695B2

(12) United States Patent

Schlykow et al.

(10) Patent No.: US 12,770,695 B2
(45) Date of Patent: Oct. 20, 2026

(54) NONVOLATILE SEMICONDUCTOR MEMORY DEVICE AND METHOD FOR CONTROLLING NONVOLATILE SEMICONDUCTOR MEMORY DEVICE

(71) Applicant: Kioxia Corporation, Tokyo (JP)

(72) Inventors: Viktoria Diana Schlykow, Kamakura (JP); Reika Tanaka, Yokohama (JP)

(73) Assignee: Kioxia Corporation, Tokyo (JP)

( * ) Notice: Subject to any disclaimer, the term of this patent is extended or adjusted under 35 U.S.C. 154(b) by 152 days.

(21) Appl. No.: 18/638,788

(22) Filed: Apr. 18, 2024

(65) Prior Publication Data

US 2024/0363176 A1 Oct. 31, 2024

(30) Foreign Application Priority Data

Apr. 28, 2023 (JP) ................................ 2023-074911

(51) Int. Cl.
*G11C 16/34* (2006.01)
*G11C 11/22* (2006.01)
(Continued)

(52) U.S. Cl.
CPC ........ *G11C 16/3404* (2013.01); *G11C 11/223* (2013.01); *G11C 11/2275* (2013.01);
(Continued)

(58) Field of Classification Search
CPC .............. G11C 16/3404; G11C 11/223; G11C 11/2275; G11C 16/0483; G11C 16/10; G11C 16/16; H10B 43/27; H10B 51/20
See application file for complete search history.

(56) References Cited

U.S. PATENT DOCUMENTS 5,270,967 A * 12/1993 Moazzami .............. G11C 11/22 365/230.06
5,838,618 A 11/1998 Lee et al.
(Continued)

FOREIGN PATENT DOCUMENTS

JP 5712420 B2 5/2015
JP 6510289 B2 5/2019
JP 2019-160374 A 9/2019

OTHER PUBLICATIONS

A. Sheikholeslami and P. G. Gulak, "A survey of circuit innovations in ferroelectric random-access memories," in Proceedings of the IEEE, vol. 88, No. 5, pp. 667-689, May (Year: 2000).*

*Primary Examiner* — Han Yang
*Assistant Examiner* — Christopher Lane Reece
(74) *Attorney, Agent, or Firm* — Oblon, McClelland, Maier & Neustadt, L.L.P.

(57) ABSTRACT

A semiconductor memory device of embodiments includes a semiconductor layer, a gate electrode layer, memory cells each including a gate insulating layer containing Si, O, and N, and a control circuit. The control circuit performs a write operation and an erase operation on the memory cells. The control circuit determine whether or not the number of times of execution of the erase operation on the memory cells has reached a predetermined number of times. When the number has reached the predetermined number of times, the control circuit perform first processing and second processing on the memory cells. The first processing applies a voltage with the same polarity as that in the write operation to the gate electrode layer with a pulse width larger than that in the write operation. The second processing applies a voltage with a polarity opposite to that in the write operation to the gate electrode layer.

24 Claims, 16 Drawing Sheets

(51) Int. Cl.

| | |
|---|---|
| ***G11C 16/04*** | (2006.01) |
| ***G11C 16/10*** | (2006.01) |
| ***G11C 16/16*** | (2006.01) |
| ***H10B 43/27*** | (2023.01) |
| ***H10B 51/20*** | (2023.01) |

(52) U.S. Cl.

CPC .......... *G11C 16/0483* (2013.01); *G11C 16/10* (2013.01); *G11C 16/16* (2013.01); *H10B 43/27* (2023.02); *H10B 51/20* (2023.02)

(56) References Cited

U.S. PATENT DOCUMENTS

| | | | | |
|---|---|---|---|---|
| 9,899,084 | B2 * | 2/2018 | Li | G11C 13/0097 |
| 10,964,385 | B1 * | 3/2021 | Yang | G11C 13/0069 |
| 2006/0198190 | A1 | 9/2006 | Lue | |
| 2007/0134855 | A1 | 6/2007 | Lai et al. | |
| 2007/0134876 | A1 | 6/2007 | Lai et al. | |
| 2007/0183208 | A1 * | 8/2007 | Tanaka | G11C 16/3418 365/185.24 |
| 2013/0258784 | A1 | 10/2013 | Lue et al. | |
| 2016/0293620 | A1 | 10/2016 | Ogata | |
| 2017/0154893 | A1 | 6/2017 | Ogata | |
| 2019/0287599 | A1 * | 9/2019 | Higashi | G11C 11/225 |
| 2021/0057416 | A1 * | 2/2021 | Kim | H10D 88/00 |
| 2021/0125656 | A1 * | 4/2021 | Müller | G11C 11/223 |
| 2022/0284968 | A1 | 9/2022 | Cao et al. | |
| 2022/0392535 | A1 * | 12/2022 | Sarpatwari | G11C 13/0028 |

* cited by examiner

BB' CROSS SECTION

AA' CROSS SECTION

NONVOLATILE SEMICONDUCTOR MEMORY DEVICE AND METHOD FOR CONTROLLING NONVOLATILE SEMICONDUCTOR MEMORY DEVICE

CROSS-REFERENCE TO RELATED APPLICATION

This application is based upon and claims the benefit of priority from Japanese Patent Application No. 2023-074911, filed on Apr. 28, 2023, the entire contents of which are incorporated herein by reference.

FIELD

Embodiments described herein relate generally to a semiconductor memory device and a method for controlling a semiconductor memory device.

BACKGROUND

In a nonvolatile semiconductor memory device in which a field effect transistor (FET) is used as a memory cell, the threshold voltage of the field effect transistor may fluctuate. It is desired to realize a semiconductor memory device having high reliability by suppressing fluctuations in the threshold voltage of the field effect transistor.

DETAILED DESCRIPTION

Figure 1:
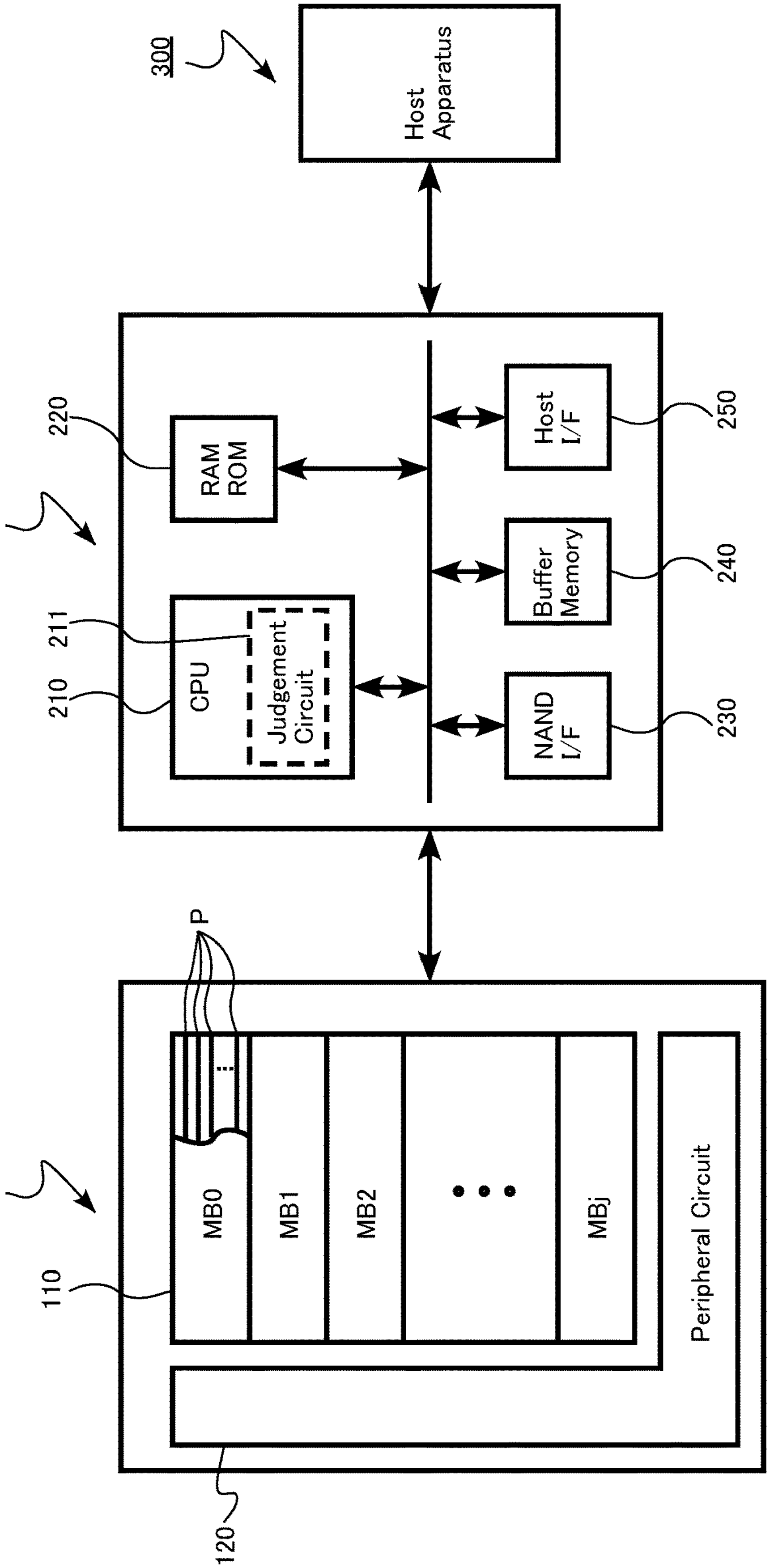
FIG. 1 is a block diagram of a memory system including a semiconductor memory device according to a first embodiment.

A semiconductor memory device of embodiments includes: a memory cell array includes a first semiconductor layer extending in a first direction; a plurality of gate electrode layers stacked in the first direction; a first wiring electrically connected to one end of the first semiconductor layer; a second wiring electrically connected to the other end of the first semiconductor layer; and a plurality of first memory cells, each of the plurality of first memory cells including a part of the first semiconductor layer, one of the plurality of gate electrode layers, and a gate insulating layer including a first insulating region containing silicon (Si), oxygen (O), and nitrogen (N) and provided between the part of the first semiconductor layer and the one of the plurality of gate electrode layers; and a control circuit configured to control the plurality of first memory cells. The control circuit is configured to perform a write operation on one first memory cell selected from the plurality of first memory cells, and in the write operation configured to apply a first voltage pulse having a first voltage with a first polarity and a first pulse width between the one of the plurality of gate electrode layers of the one first memory cell and at least one of the first wiring or the second wiring, the control circuit is configured to perform an erase operation on the plurality of first memory cells, and in the erase operation configured to apply a second voltage pulse having a second voltage with a second polarity opposite to the first polarity and a second pulse width between each of the gate electrode layers of the plurality of first memory cells and at least one of the first wiring or the second wiring, the control circuit is configured to determine whether or not the number of times of execution of the erase operation on the plurality of first memory cells has reached a first predetermined number of times, the control circuit is configured to perform first processing on the plurality of first memory cells when it is determined that the number of times of execution has reached the first predetermined number of times, and in the first processing configured to apply a third voltage pulse having a third voltage with the first polarity and an absolute value equal to or more than an absolute value of the first voltage and a third pulse width larger than the first pulse width between each of the gate electrode layers of the plurality of first memory cells and at least one of the first wiring or the second wiring, and the control circuit is configured to perform second processing on the plurality of first memory cells after the first processing, and in the second processing configured to apply a fourth voltage pulse having a fourth voltage with the second polarity and an absolute value equal to or more than an absolute value of the second voltage and a fourth pulse width between each of the gate electrode layers of the plurality of first memory cells and at least one of the first wiring or the second wiring.

Hereinafter, embodiments will be described with reference to the diagrams. In addition, in the following description, the same or similar members and the like are denoted by the same reference numerals, and the description of the members and the like once described will be omitted as appropriate. In addition, for components with reference numerals followed by numbers or letters for differentiation, if there is no need to distinguish between the components for the purpose of explanation, reference numerals may be used with the numbers or letters at the end omitted.

The qualitative analysis and quantitative analysis of the chemical composition of members configuring the semiconductor memory device in this specification can be performed by, for example, secondary ion mass spectroscopy (SIMS), energy dispersive X-ray spectroscopy (EDX), electron energy loss spectroscopy (EELS), or X-ray photoelectron spectroscopy (XPS). In addition, when measuring the thickness of each member forming the semiconductor memory device, a distance between members, and the like, for example, a transmission electron microscope (TEM) can be used.

First Embodiment

A semiconductor memory device according to a first embodiment includes a memory cell array includes a first semiconductor layer extending in a first direction; a plurality of gate electrode layers stacked in the first direction; a first wiring electrically connected to one end of the first semiconductor layer; a second wiring electrically connected to the other end of the first semiconductor layer; and a plurality of first memory cells, each of the plurality of first memory cells including a part of the first semiconductor layer, one of the plurality of gate electrode layers, and a gate insulating layer including a first insulating region containing silicon (Si), oxygen (O), and nitrogen (N) and provided between the part of the first semiconductor layer and the one of the plurality of gate electrode layers; and a control circuit configured to control the plurality of first memory cells. The control circuit is configured to perform a write operation on one first memory cell selected from the plurality of first memory cells, and in the write operation configured to apply a first voltage pulse having a first voltage with a first polarity and a first pulse width between the one of the plurality of gate electrode layers of the one first memory cell and at least one of the first wiring or the second wiring. The control circuit is configured to perform an erase operation on the plurality of first memory cells, and in the erase operation configured to apply a second voltage pulse having a second voltage with a second polarity opposite to the first polarity and a second pulse width between each of the gate electrode layers of the plurality of first memory cells and at least one of the first wiring or the second wiring. The control circuit is configured to determine whether or not the number of times of execution of the erase operation on the plurality of first memory cells has reached a first predetermined number of times. The control circuit is configured to perform first processing on the plurality of first memory cells when it is determined that the number of times of execution has reached the first predetermined number of times, and in the first processing configured to apply a third voltage pulse having a third voltage with the first polarity and an absolute value equal to or more than an absolute value of the first voltage and a third pulse width larger than the first pulse width between each of the gate electrode layers of the plurality of first memory cells and at least one of the first wiring or the second wiring. The control circuit is configured to perform second processing on the plurality of first memory cells after the first processing, and in the second processing configured to apply a fourth voltage pulse having a fourth voltage with the second polarity and an absolute value equal to or more than an absolute value of the second voltage and a fourth pulse width between each of the gate electrode layers of the plurality of first memory cells and at least one of the first wiring or the second wiring.

The semiconductor memory device according to the first embodiment includes a three-dimensional NAND flash memory. A memory cell of the semiconductor memory device according to the first embodiment is a so-called metal-oxide-nitride-oxide-semiconductor type (MONOS type) memory cell.

FIG. 1 is a block diagram of a memory system including the semiconductor memory device according to the first embodiment. The memory system according to the first embodiment includes, for example, a three-dimensional NAND flash memory 100, a controller 200, and a host apparatus 300. The semiconductor memory device according to the first embodiment includes, for example, the three-dimensional NAND flash memory 100 and the controller 200.

The three-dimensional NAND flash memory 100 is, for example, a three-dimensional NAND flash memory chip. In addition, the controller 200 is, for example, a controller chip.

The three-dimensional NAND flash memory 100 and the controller 200 are, for example, a memory card in which the two are implemented in combination, or a solid state drive (SSD) in which the two are implemented in combination.

The three-dimensional NAND flash memory 100 and the controller 200 may be provided within the same semiconductor chip, for example.

The host apparatus 300 is, for example, a digital camera or a personal computer.

As shown in FIG. 1, the three-dimensional NAND flash memory 100 includes a memory cell array 110 and a peripheral circuit 120.

The memory cell array 110 includes a plurality of memory blocks MB0 to MBj (j is a natural number). Each of the plurality of memory blocks MB0 to MBj includes a plurality of pages P. In the first embodiment, a data write operation and a data read operation are performed by using a page P as one unit. In addition, in the first embodiment, a data erase operation is performed by using a memory block MBi (i is a natural number equal to or less than j) as one unit. In addition, in the first embodiment, a recovery operation and a charge removing operation are performed by using the memory block MBi (i is a natural number equal to or less than j) as one unit.

The recovery operation is an example of the first processing. The charge removing operation is an example of the second processing.

The peripheral circuit 120 is provided around the memory cell array 110. For example, the peripheral circuit 120 has a function of controlling the operation of the memory cell array 110 according to an instruction received from the controller 200. The peripheral circuit 120 performs, for example, a data write operation or a data read operation for the page P designated by the controller 200. In addition, the peripheral circuit 120 performs, for example, a data erase operation for the memory block MBi designated by the controller 200. In addition, the peripheral circuit 120 performs, for example, a recovery operation or a charge removing operation for the memory block MBi designated by the controller 200.

The controller 200 controls the three-dimensional NAND flash memory 100. In addition, the controller 200 accesses the three-dimensional NAND flash memory 100 in response to an instruction received from the host apparatus 300.

The peripheral circuit 120 of the three-dimensional NAND flash memory 100 and the controller 200 are an example of the control circuit according to the first embodiment.

As shown in FIG. 1, the controller 200 includes a processor 210 (CPU), a built-in memory 220 (RAM, ROM), a NAND interface circuit 230, a buffer memory 240, and a host interface circuit 250. The processor 210 includes a judgement circuit 211.

The processor 210 controls the overall operation of the controller 200. The processor 210 has a function of performing various processes for managing the three-dimensional NAND flash memory 100. The judgement circuit 211 can determine whether or not the number of times of execution of an erase operation on a specific memory cell has reached a predetermined number of times.

The built-in memory 220 is, for example, a semiconductor memory. The built-in memory 220 is used, for example, as a work area for the processor. In addition, the built-in memory 220 stores, for example, firmware for managing the three-dimensional NAND flash memory 100 and various management tables.

The built-in memory 220 stores, for example, the number of times of execution of an erase operation on memory cells included in the three-dimensional NAND flash memory 100. In addition, the built-in memory 220 stores, for example, a predetermined number of times for the erase operation, which is a criterion for determining whether or not to perform a recovery operation. The judgement circuit 211 determines whether or not the number of times of execution of the erase operation on a specific memory cell has reached a predetermined number of times based on the number of times of execution of the erase operation and the predetermined number of times for the erase operation stored in the built-in memory 220.

The NAND interface circuit 230 is connected to the three-dimensional NAND flash memory 100 through a NAND bus. The NAND interface circuit 230 has a function of controlling communication with the three-dimensional NAND flash memory 100.

The buffer memory 240 has a function of temporarily storing data written into memory cells or data read from memory cells, for example.

The host interface circuit 250 is connected to the host apparatus 300 through a host bus. The host interface circuit 250 transmits instructions received from the host apparatus 300 to the processor 210, for example. In addition, the host interface circuit 250 transmits data received from the host apparatus 300 to the buffer memory 240, for example. In addition, the host interface circuit 250 transmits data in the buffer memory 240 to the host apparatus 300 in response to an instruction from the processor 210, for example.

Figure 2:
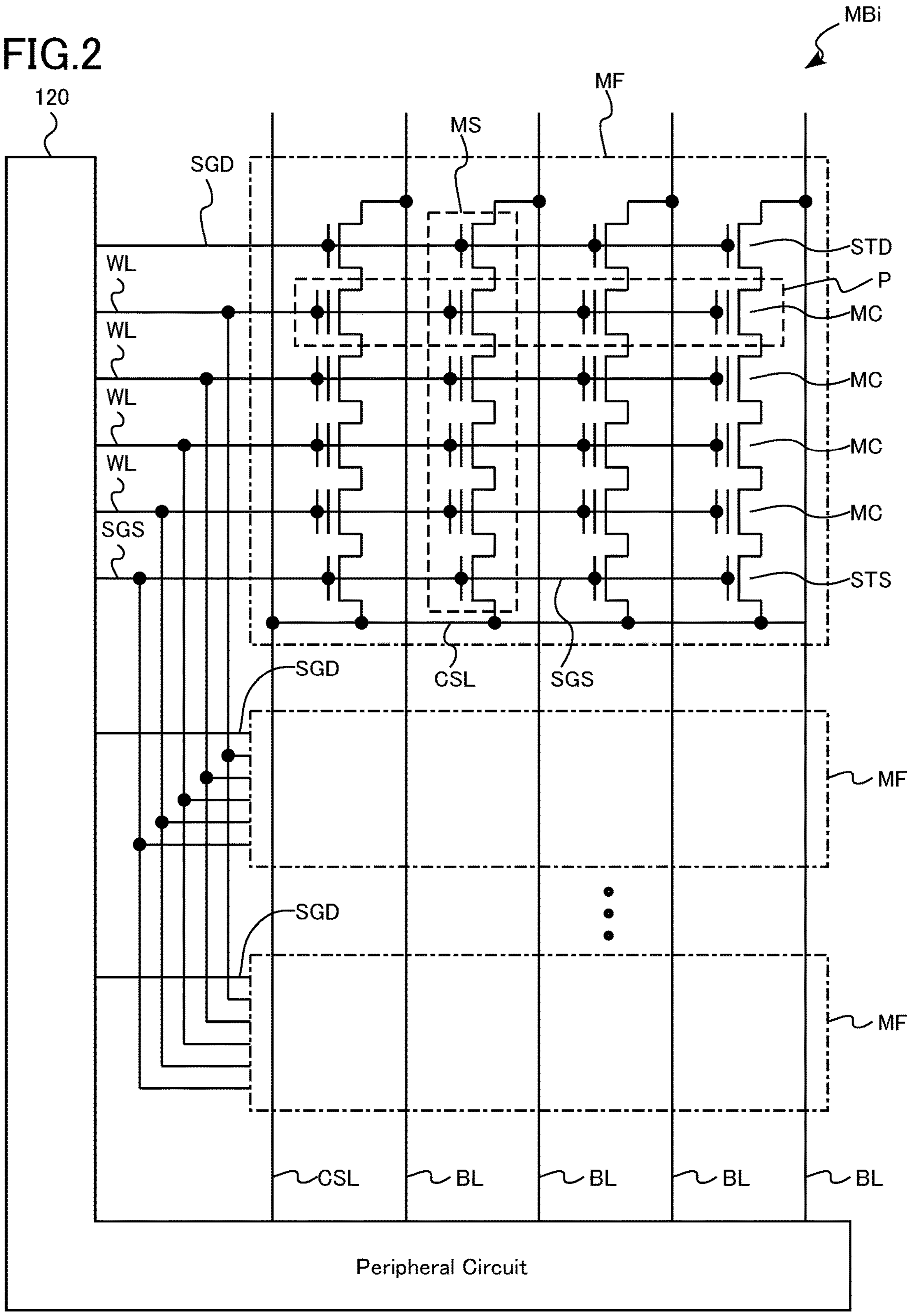
FIG. 2 is an equivalent circuit diagram of a memory block of the semiconductor memory device according to the first embodiment.

FIG. 2 is an equivalent circuit diagram of a memory block of the semiconductor memory device according to the first embodiment. FIG. 2 is an equivalent circuit diagram of the memory block MBi of the three-dimensional NAND flash memory 100.

The memory block MBi is connected to the peripheral circuit 120 by a common source line CSL, a plurality of bit lines BL, a plurality of word lines WL, a source selection gate line SGS, and a drain selection gate line SGD.

The memory block MBi includes a plurality of memory fingers MF. Each memory finger MF includes a plurality of memory strings MS.

One end of each of the plurality of memory strings MS is connected to the common source line CSL. The other end of each of the plurality of memory strings MS is connected to the bit line BL.

Each of the plurality of memory strings MS includes a source selection transistor STS, a plurality of memory cells MC, and a drain selection transistor STD connected in series between the common source line CSL and the bit line BL. The source selection transistor STS, the plurality of memory cells MC, and the drain selection transistor STD are field effect transistors (FETs) whose operations are controlled by voltages applied to their gate electrodes.

The word line WL is connected to the gate electrode of each of the plurality of memory cells MC. The word line WL is commonly connected to all memory strings MS in one memory finger MF. In addition, in one memory block MBi, a plurality of word lines WL connected to one memory finger MF are commonly connected to a plurality of word lines connected to the remaining memory fingers MF. In addition, in one memory finger MF, a plurality of memory cells MC commonly connected to one word line WL form the page P.

The source selection gate line SGS is connected to the gate electrode of the source selection transistor STS. The drain selection gate line SGD is connected to the gate electrode of the drain selection transistor STD.

Figure 3:
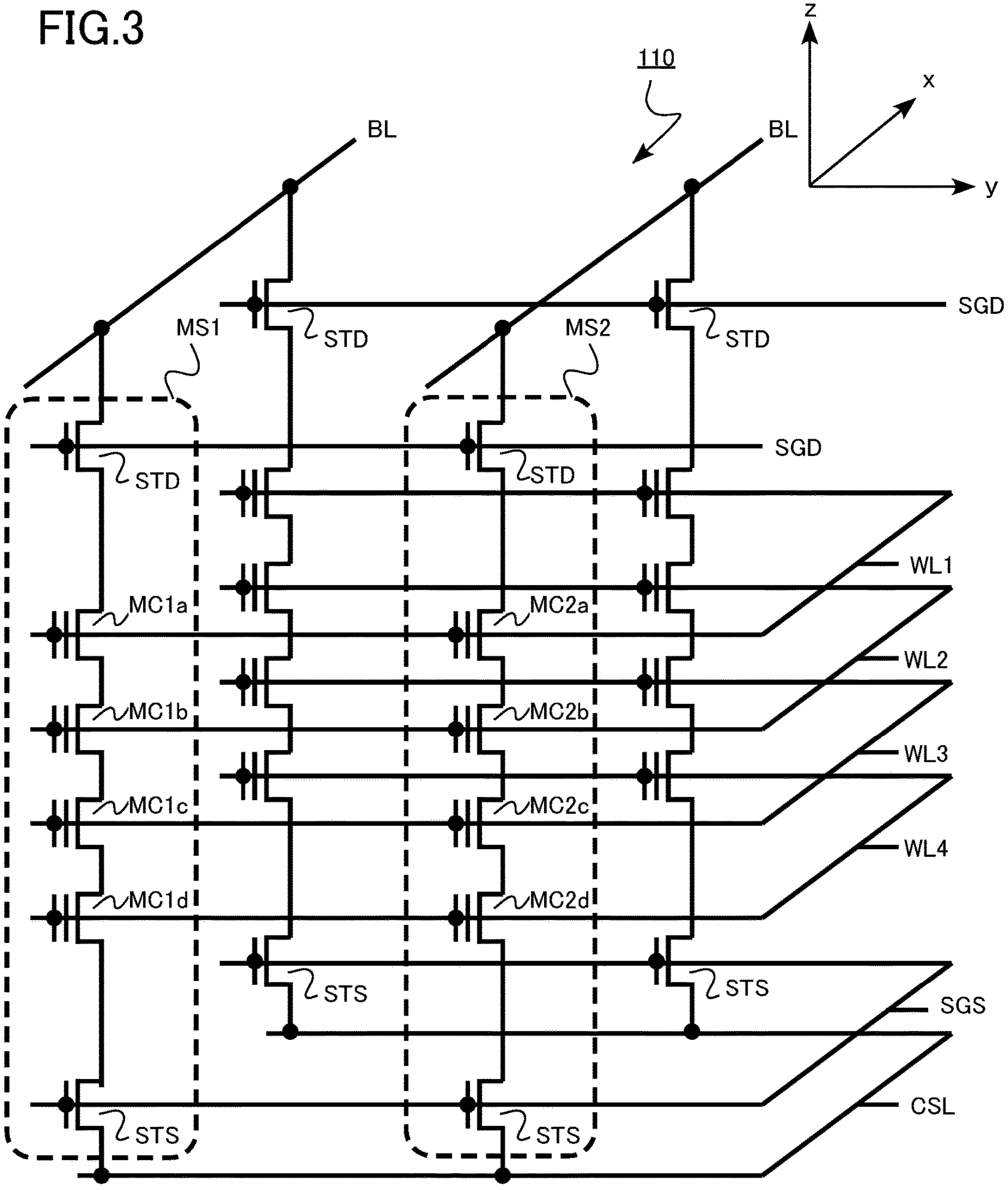
FIG. 3 is an equivalent circuit diagram of a part of a memory cell array of the semiconductor memory device according to the first embodiment.

FIG. 3 is an equivalent circuit diagram of a part of a memory cell array of the semiconductor memory device according to the first embodiment. FIG. 3 is an equivalent circuit diagram of a part of the memory cell array 110 of the three-dimensional NAND flash memory 100. FIG. 3 is an equivalent circuit diagram of a part of the memory block MBi of the three-dimensional NAND flash memory 100.

The plurality of word lines WL are arranged in the z direction so as to be spaced from each other. The plurality of word lines WL are arranged so as to be stacked in the z direction. The plurality of memory strings MS extend in the z direction. The plurality of bit lines BL extend in the x direction, for example. The plurality of memory strings MS include a first memory string MS1 and a second memory string MS2.

Hereinafter, the x direction is defined as a third direction, the y direction is defined as a second direction, and the z direction is defined as a first direction. The x direction, the y direction, and the z direction cross each other. For example, the x direction, the y direction, and the z direction are perpendicular to each other.

As shown in FIG. 3, the memory string MS includes the source selection transistor STS, a plurality of memory cells MC, and the drain selection transistor STD connected in series between the common source line CSL and the bit line BL. The memory string MS is electrically connected to the common source line CSL and the bit line BL. The common source line CSL is an example of the first wiring. The bit line BL is an example of the second wiring or the third wiring.

The first memory string MS1 includes, for example, a plurality of first memory cells MC1a, MC1b, MC1c, and MC1d. In addition, the second memory string MS2 includes, for example, a plurality of second memory cells MC2a, MC2b, MC2c, and MC2d.

In addition, although FIG. 3 shows a case where the number of memory cells MC included in one memory string MS is 4, the number of memory cells MC is not limited to 4. The number of memory cells MC may be equal to or less than 3 or may be equal to or more than 5.

One memory string MS can be selected by selecting one bit line BL and one drain selection gate line SGD, and one memory cell MC can be selected by selecting one word line WL. The word line WL is a gate electrode of a memory cell transistor forming the memory cell MC.

Figure 4:
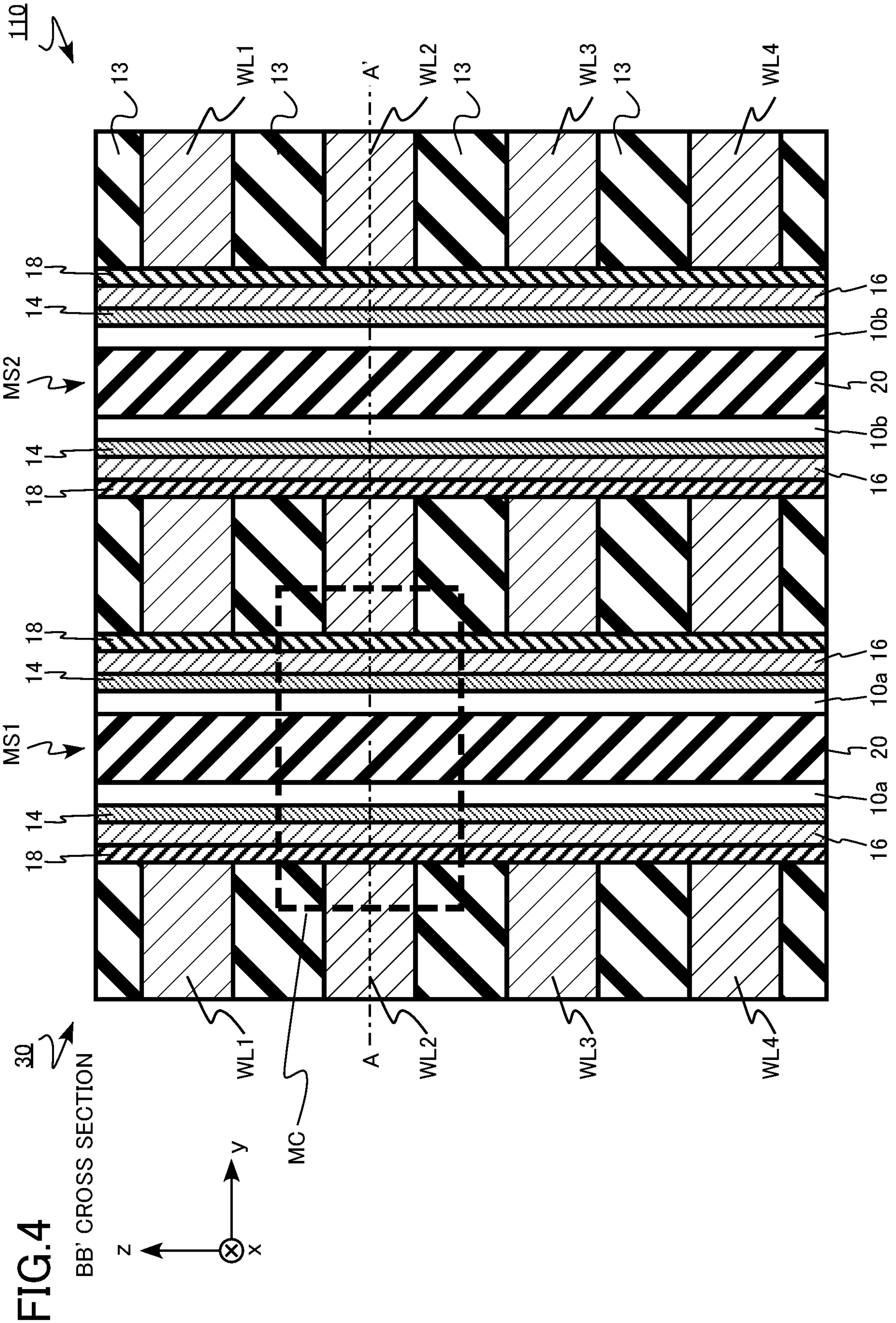
FIG. 4 is a schematic cross-sectional view of a part of the memory cell array of the semiconductor memory device according to the first embodiment.
Figure 5:
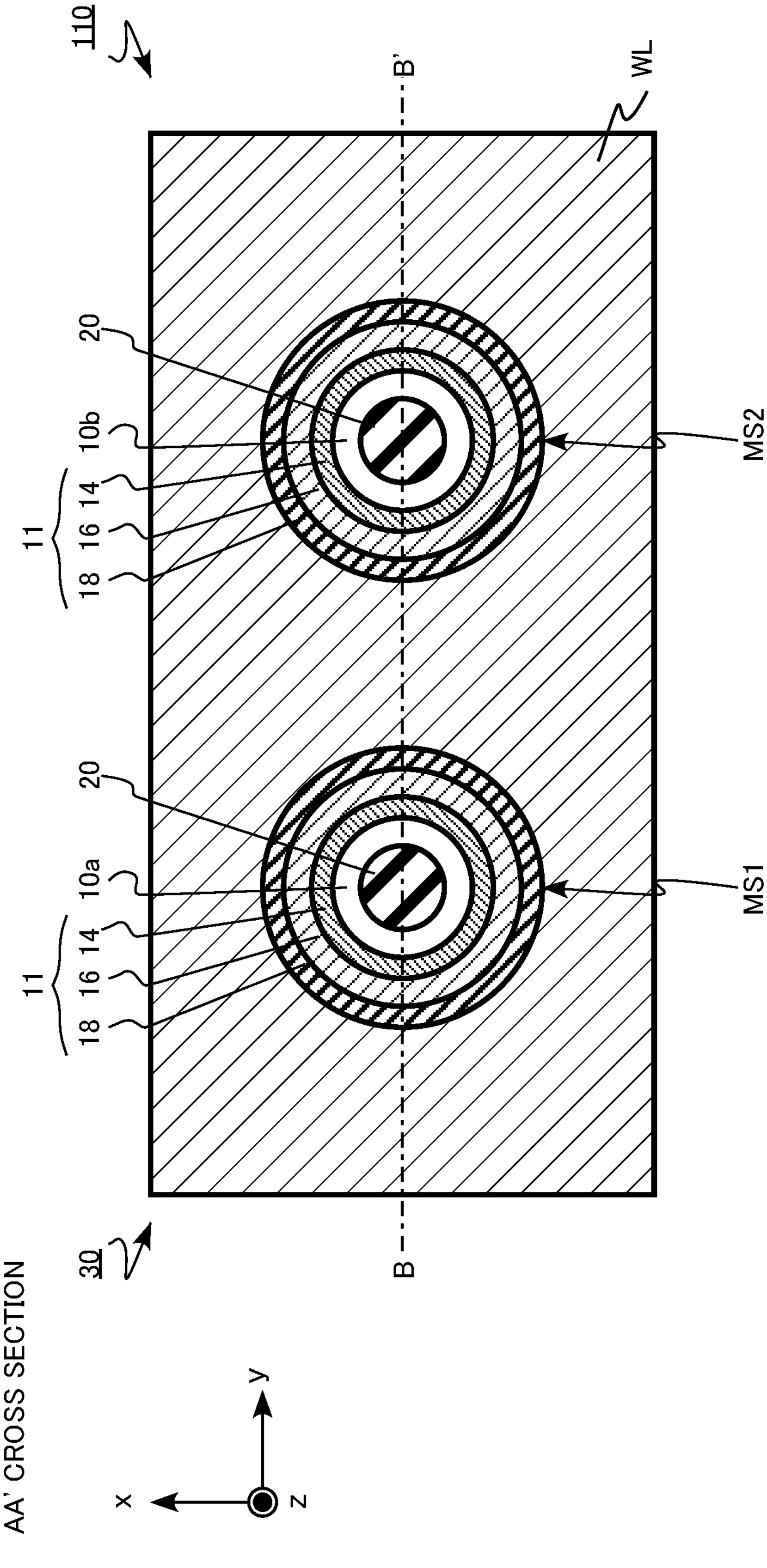
FIG. 5 is a schematic cross-sectional view of a part of the memory cell array of the semiconductor memory device according to the first embodiment.

FIGS. 4 and 5 are schematic cross-sectional views of a part of a memory cell array of the semiconductor memory device according to the first embodiment. FIGS. 4 and 5 show cross sections of a plurality of memory cells MC in the first memory string MS1 and the second memory string MS2 in the memory cell array 110 shown in FIG. 3.

FIG. 4 is a yz cross-sectional view of the memory cell array 110. FIG. 4 is a cross-sectional view taken along the line BB' of FIG. 5. FIG. 5 is an xy cross-sectional view of the memory cell array 110. FIG. 5 is a cross-sectional view taken along the line AA' of FIG. 4. In FIG. 4, the region surrounded by the broken line is one memory cell MC.

Figure 6:
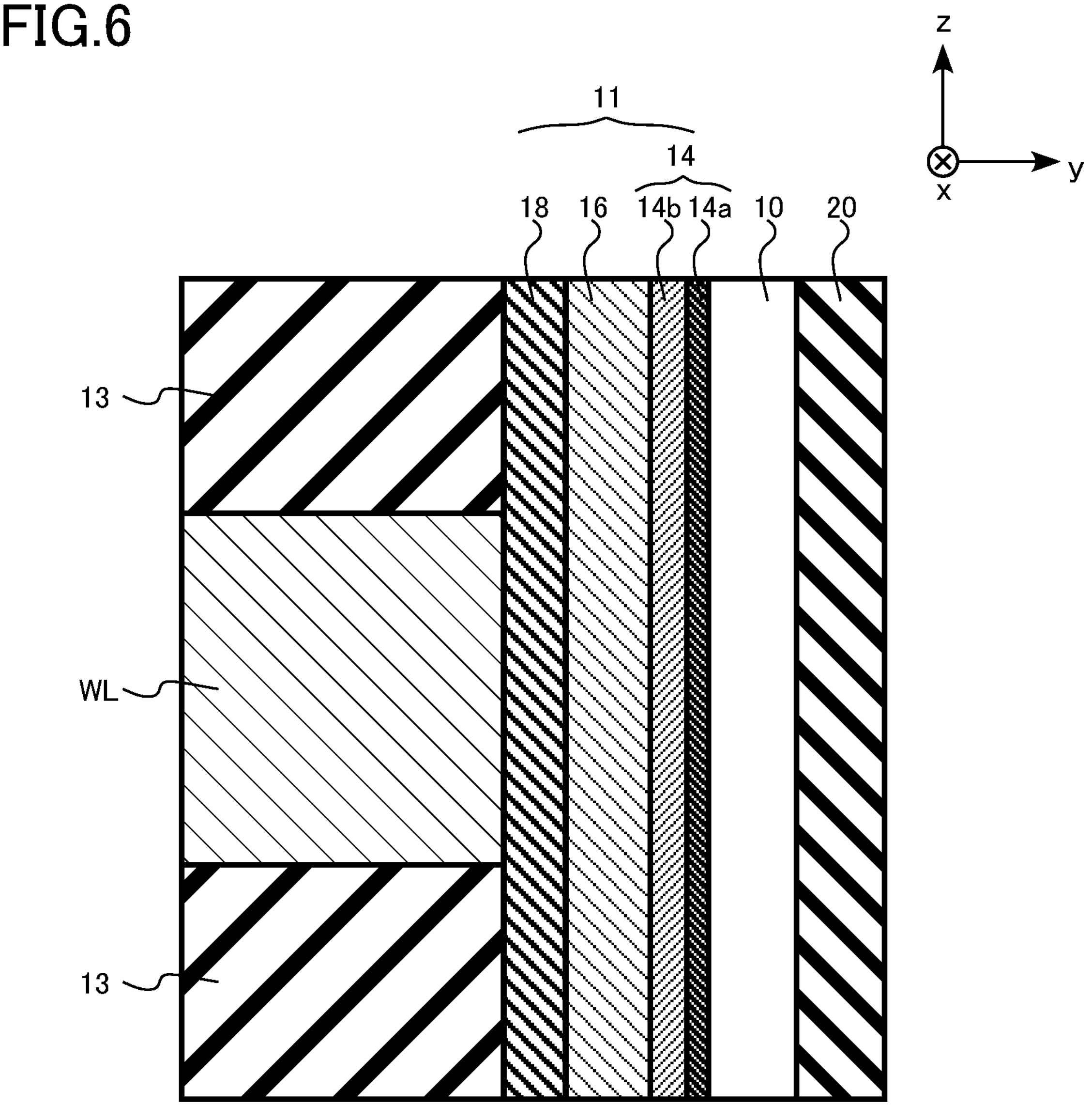
FIG. 6 is a schematic cross-sectional view of a part of a memory cell of the semiconductor memory device according to the first embodiment.

FIG. 6 is a schematic cross-sectional view of a part of a memory cell of the semiconductor memory device according to the first embodiment. FIG. 6 is an enlarged view of a part of FIG. 4.

As shown in FIGS. 4, 5, and 6, the memory cell array 110 includes the word line WL, a semiconductor layer 10, a gate insulating layer 11, an interlayer insulating layer 13, and a core insulating region 20. A plurality of word lines WL and a plurality of interlayer insulating layers 13 form a stacked body 30.

The plurality of word lines WL include a first word line WL1, a second word line WL2, a third word line WL3, and a fourth word line WL4. The gate insulating layer 11 includes a tunnel insulating layer 14, a charge storage layer 16, and a block insulating layer 18.

The word line WL is an example of a gate electrode layer. The tunnel insulating layer 14 is an example of the first insulating region or the third insulating region. The block insulating layer 18 is an example of the second insulating region. The charge storage layer 16 is an example of a charge storage region.

The memory cell array 110 is provided, for example, on a semiconductor substrate (not shown). The semiconductor substrate has, for example, a surface parallel to the x and y directions.

The word line WL and the interlayer insulating layer 13 are alternately stacked in the z direction on the semiconductor substrate. The word lines WL are repeatedly arranged in the z direction so as to be spaced from each other. The word line WL functions as a control electrode of a memory cell transistor.

The word line WL is, for example, a plate-shaped conductor. The word line WL is, for example, a metal.

The thickness of the word line WL in the z direction is, for example, equal to or more than 5 nm and equal to or less than 20 nm.

The interlayer insulating layer 13 is provided in the z direction of the word line WL. The word line WL and the interlayer insulating layer 13 are repeatedly arranged in the z direction.

The interlayer insulating layer 13 separates the word line WL and the word line WL from each other. The interlayer insulating layer 13 electrically separates the word line WL and the word line WL from each other.

The interlayer insulating layer 13 is, for example, an oxide, an oxynitride, or a nitride. The interlayer insulating layer 13 is, for example, a silicon oxide layer. The thickness of the interlayer insulating layer 13 in the z direction is, for example, equal to or more than 5 nm and equal to or less than 20 nm.

The semiconductor layer 10 is provided in the stacked body 30. The semiconductor layer 10 extends in the z direction. The semiconductor layer 10 extends in a direction perpendicular to the surface of the semiconductor substrate.

The semiconductor layer 10 is provided so as to penetrate the stacked body 30. The semiconductor layer 10 is surrounded by a plurality of word lines WL. The semiconductor layer 10 has, for example, a cylindrical shape. The semiconductor layer 10 functions as a channel of the memory cell transistor.

The semiconductor layer 10 is, for example, a polycrystalline semiconductor. The semiconductor layer 10 is, for example, polycrystalline silicon.

The semiconductor layer 10 includes, for example, a first semiconductor layer **10*a* and a second semiconductor layer 10*b***.

The semiconductor layer 10 is electrically connected to the common source line CSL and the bit line BL. One end of the semiconductor layer 10 is connected to the common source line CSL. The other end of the semiconductor layer 10 is connected to the bit line BL. The first semiconductor layer **10*a* and the second semiconductor layer 10*b*** are electrically connected to the common source line CSL and the bit line BL.

The common source line CSL is an example of the first wiring. In addition, the bit line BL is an example of the second wiring or the third wiring. For example, a bit line electrically connected to the first semiconductor layer **10*a* is an example of the second wiring. In addition, for example, a bit line electrically connected to the second semiconductor layer 10*b*** is an example of the third wiring.

The tunnel insulating layer 14 is provided between the semiconductor layer 10 and the word line WL. The tunnel insulating layer 14 is provided between the semiconductor layer 10 and the charge storage layer 16. The tunnel insulating layer 14 has a function of allowing a charge to pass according to the voltage applied between the word line WL and the semiconductor layer 10.

The tunnel insulating layer 14 contains silicon (Si), nitrogen (N), and oxygen (O). The tunnel insulating layer 14 contains, for example, silicon oxynitride. The tunnel insulating layer 14 is, for example, a silicon oxynitride layer. The thickness of the tunnel insulating layer 14 is, for example, equal to or more than 1 nm and equal to or less than 8 nm.

The tunnel insulating layer 14 may have a stacked structure of a plurality of films. As shown in FIG. 6, the tunnel insulating layer 14 includes, for example, a stacked structure of a silicon oxide film **14*a* and a silicon oxynitride film 14*b***.

The charge storage layer 16 is provided between the tunnel insulating layer 14 and the block insulating layer 18.

The charge storage layer 16 has a function of trapping and storing charges. The charge is, for example, an electron. The threshold voltage of the memory cell transistor changes according to the amount of charges stored in the charge storage layer 16. By using the threshold voltage change, one memory cell MC can store data.

For example, when the threshold voltage of the memory cell transistor changes, the voltage at which the memory cell transistor is turned on changes. For example, if a state in which the threshold voltage is high is defined as data "0" and a state in which the threshold voltage is low is defined as data "1", the memory cell MC can store 1-bit data of "0" and "1".

The charge storage layer 16 is an insulator. The charge storage layer 16 contains, for example, silicon (Si) and nitrogen (N). The charge storage layer 16 contains, for example, silicon nitride. The charge storage layer 16 is, for example, a silicon nitride layer. The thickness of the charge storage layer 16 is, for example, equal to or more than 3 nm and equal to or less than 10 nm.

The block insulating layer 18 is provided between the tunnel insulating layer 14 and the word line WL. The block insulating layer 18 is provided between the charge storage layer 16 and the word line WL. The block insulating layer 18 has a function of blocking the current flowing between the charge storage layer 16 and the word line WL.

The block insulating layer 18 is an insulator. The block insulating layer 18 contains, for example, silicon (Si) and oxygen (O). The block insulating layer 18 contains, for example, silicon oxide. The block insulating layer 18 is, for example, a silicon oxide layer.

The block insulating layer 18 contains, for example, aluminum (Al) and oxygen (O). The block insulating layer 18 contains, for example, aluminum oxide. The block insulating layer 18 is, for example, an aluminum oxide layer.

The block insulating layer 18 has, for example, a stacked structure of a silicon oxide layer and an aluminum oxide layer.

The thickness of the block insulating layer 18 in the y direction from the semiconductor layer 10 toward the word line WL is, for example, equal to or more than 1 nm and equal to or less than 8 nm.

The core insulating region 20 is provided in the stacked body 30. The core insulating region 20 extends in the z direction. The core insulating region 20 is provided so as to penetrate the stacked body 30. The core insulating region 20 is surrounded by the semiconductor layer 10. The core insulating region 20 is surrounded by a plurality of word lines WL. The core insulating region 20 has a columnar shape. The core insulating region 20 has, for example, a cylindrical shape.

The core insulating region 20 is, for example, an oxide, an oxynitride, or a nitride. The core insulating region 20 contains, for example, silicon (Si) and oxygen (O). The core insulating region 20 is, for example, a silicon oxide layer.

Figure 7:
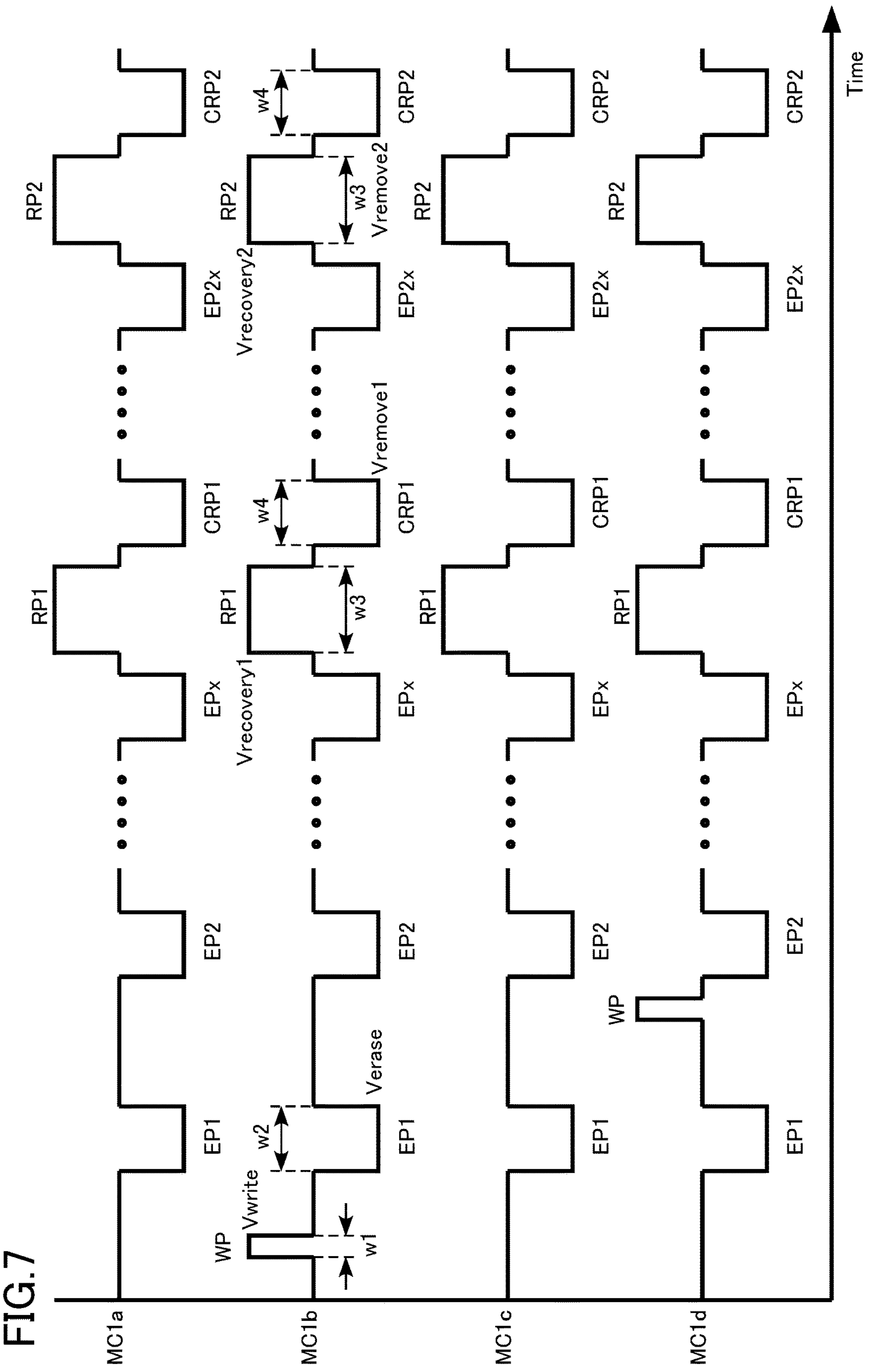
FIG. 7 is a timing chart illustrating the control of the semiconductor memory device according to the first embodiment.

FIG. 7 is a timing chart illustrating the control of the semiconductor memory device according to the first embodiment. FIG. 7 shows voltage pulses applied to the gate insulating layer 11 of each of first memory cells MC1a to MC1d included in the first memory string MS1.

The peripheral circuit 120 of the three-dimensional NAND flash memory 100 and the controller 200 control, for example, a plurality of memory cells MC in the memory cell array 110. For example, the peripheral circuit 120 and the controller 200 control the first memory cells MC1a to MC1d included in the first memory string MS1. In addition, for example, the peripheral circuit 120 and the controller 200 control second memory cells MC2a to MC2d included in the second memory string MS2.

For example, the peripheral circuit 120 and the controller 200 can perform a data write operation on any one first memory cell MC1 selected from the first memory cells MC1a to MC1d.

The write operation is, for example, to apply a write voltage pulse WP between the bit line BL and the gate electrode layer of any one first memory cell MC1. The write operation is, for example, to apply the write voltage pulse WP between the first semiconductor layer 10*a* and the gate electrode layer of the any one first memory cell MC1 by applying the write voltage pulse WP between the bit line BL and the gate electrode layer of the any one first memory cell MC1. The write operation is, for example, to apply the write voltage pulse WP to the gate insulating layer of the any one first memory cell MC1 by applying the write voltage pulse WP between the first semiconductor layer 10*a* and the gate electrode layer of the any one first memory cell MC1.

The write voltage pulse WP has a write voltage Vwrite with a first polarity and a first pulse width w1. The write operation is performed in units of pages P.

The write voltage pulse WP is an example of the first voltage pulse. The write voltage Vwrite is an example of the first voltage.

In addition, the peripheral circuit 120 and the controller 200 can perform, for example, a data erase operation on a plurality of first memory cells MC1 and a plurality of second memory cells MC2.

The erase operation is, for example, to apply an erase voltage pulse EP between the common source line CSL and the word line WL of each of the plurality of first memory cells MC1. The erase operation is, for example, to apply the erase voltage pulse EP between the first semiconductor layer 10*a* and the word line WL of each of the plurality of first memory cells MC1 by applying the erase voltage pulse EP between the common source line CSL and the word line WL of each of the plurality of first memory cells MC1. The erase operation is, for example, to apply the erase voltage pulse EP to the gate insulating layer of each of the plurality of first memory cells MC1 by applying the erase voltage pulse EP between the first semiconductor layer 10*a* and the word line WL of each of the plurality of first memory cells MC1.

The erase operation is, for example, to apply the erase voltage pulse EP between the common source line CSL and the word line WL of each of a plurality of second memory cells MC2. The erase operation is, for example, to apply the erase voltage pulse EP between the second semiconductor layer 10*b* and the word line WL of each of the plurality of second memory cells MC2 by applying the erase voltage pulse EP between the common source line CSL and the word line WL of each of the plurality of second memory cells MC2. The erase operation is, for example, to apply the erase voltage pulse EP to the gate insulating layer of each of the plurality of second memory cells MC2 by applying the erase voltage pulse EP between the second semiconductor layer 10*b* and the word line WL of each of the plurality of second memory cells MC2.

The erase voltage pulse EP has an erase voltage Verase with a second polarity opposite to the first polarity and a second pulse width w2. The erase operation is performed in units of memory blocks MBi.

The erase voltage pulse EP is an example of the second voltage pulse. The erase voltage Verase is an example of the second voltage. In FIG. 7, an erase voltage pulse EP1, an erase voltage pulse EP2, an erase voltage pulse EPx, and an erase voltage pulse EP2x are examples of the second voltage pulse.

In addition, the peripheral circuit 120 and the controller 200 can determine whether or not the number of times of execution of the erase operation on the plurality of first memory cells MC1 and the plurality of second memory cells MC2 has reached a first predetermined number of times. Specifically, the judgement circuit 211 of the controller 200 determines whether or not the number of times of execution of the erase operation on the plurality of first memory cells MC1 and the plurality of second memory cells MC2 has reached a predetermined number of times based on the number of times of execution of the erase operation stored in the built-in memory 220 and the first predetermined number of times for the erase operation stored in the built-in memory 220.

In addition, when it is determined that the number of times of execution of the erase operation has reached the first predetermined number of times, the peripheral circuit 120 and the controller 200 can perform a first recovery operation on the plurality of first memory cells MC1 and the plurality of second memory cells MC2. The first recovery operation is an example of the first processing.

The first recovery operation is, for example, to apply a first recovery voltage pulse RP1 between the bit line BL and the word line WL of each of the plurality of first memory cells MC1. The first recovery operation is, for example, to apply the first recovery voltage pulse RP1 between the first semiconductor layer 10*a* and the word line WL of each of the plurality of first memory cells MC1 by applying the first recovery voltage pulse RP1 between the bit line BL and the word line WL of each of the plurality of first memory cells MC1. The first recovery operation is, for example, to apply the first recovery voltage pulse RP1 to the gate insulating layer of each of the plurality of first memory cells MC1 by applying the first recovery voltage pulse RP1 between the first semiconductor layer 10*a* and the word line WL of each of the plurality of first memory cells MC1.

In the first recovery operation, the application of the first recovery voltage pulse RP1 between the common source line CSL and the word line WL of each of the plurality of first memory cells MC1 is performed simultaneously for the plurality of first memory cells MC1, for example.

In the first recovery operation, the application of the first recovery voltage pulse RP1 between the common source line CSL and the word line WL of each of the plurality of first memory cells MC1 is performed, for example, for each group obtained by dividing the plurality of first memory cells MC1 into a plurality of groups. For example, the first memory cell MC1a and the first memory cell MC1c are set as a first group, and the first memory cell MC1b and the first memory cell MC1d are set as a second group. Then, the first recovery voltage pulse RP1 is applied between the common source line CSL and the word line WL of the first memory cell MC1 of the first group, and then the first recovery voltage pulse RP1 is applied between the common source line CSL and the word line WL of the first memory cell MC1 of the second group. In addition, for example, the first recovery voltage pulse RP1 is applied between the common source line CSL and the word line of each of the first memory cells MC1a to MC1d at sequentially shifted times.

In addition, the first recovery operation is, for example, to apply the first recovery voltage pulse RP1 between the bit line BL and the word line WL of each of the plurality of second memory cells MC2. The first recovery operation is, for example, to apply the first recovery voltage pulse RP1 between the second semiconductor layer 10*b* and the word line WL of each of the plurality of second memory cells MC2 by applying the first recovery voltage pulse RP1 between the bit line BL and the word line WL of each of the plurality of second memory cells MC2. The first recovery operation is, for example, to apply the first recovery voltage pulse RP1 to the gate insulating layer of each of the plurality of second memory cells MC2 by applying the first recovery voltage pulse RP1 between the second semiconductor layer 10*b* and the word line WL of each of the plurality of second memory cells MC2.

In the first recovery operation, the application of the first recovery voltage pulse RP1 between the common source line CSL and the word line WL of each of the plurality of second memory cells MC2 is performed simultaneously for the plurality of second memory cells MC2, for example. In the first recovery operation, the application of the first recovery voltage pulse RP1 between the common source line CSL and the word line WL of each of the plurality of second memory cells MC2 is performed, for example, for each group obtained by dividing the plurality of second memory cells MC2 into a plurality of groups.

The first recovery voltage pulse RP1 has a first recovery voltage Vrecovery1 with a first polarity and an absolute value, which is equal to or more than the absolute value of the write voltage Vwrite, and a third pulse width w3 larger than the first pulse width w1.

The first recovery voltage pulse RP1 is an example of the third voltage pulse. The first recovery voltage Vrecovery1 is an example of the third voltage.

The third pulse width w3 is, for example, equal to or more than 10 msec and equal to or less than 1 sec. The third pulse width w3 is, for example, 10 times or greater than the first pulse width w1 and 1000 times or less than the first pulse width w1. The third pulse width w3 is, for example, larger than the second pulse width w2.

The absolute value of the first recovery voltage Vrecovery1 may be, for example, equal to or larger than the absolute value of the write voltage Vwrite.

The peripheral circuit 120 and the controller 200 can perform the first recovery operation, for example, immediately after the erase operation. For example, after the erase operation, the peripheral circuit 120 and the controller 200 can perform the first recovery operation without performing a write operation on any of the plurality of first memory cells MC1 and the plurality of second memory cells MC2.

For example, after the erase operation, the peripheral circuit 120 and the controller 200 can perform the first recovery operation without applying a voltage pulse between the word line WL and the bit line BL of any of the plurality of first memory cells MC1 and the plurality of second memory cells MC2. For example, after the erase operation, the peripheral circuit 120 and the controller 200 can perform the first recovery operation without applying a voltage pulse to the gate insulating layer of any of the plurality of first memory cells MC1 and the plurality of second memory cells MC2.

In addition, the peripheral circuit 120 and the controller 200 can perform a first charge removing operation on the plurality of first memory cells MC1 and the plurality of second memory cells MC2 after the first recovery operation. The first charge removing operation is an example of the second processing.

The first charge removing operation is, for example, to apply a first charge removing voltage pulse CRP1 between the common source line CSL and the word line WL of each of the plurality of first memory cells MC1. The first charge removing operation is, for example, to apply the first charge removing voltage pulse CRP1 between the first semiconductor layer 10*a* and the word line WL of each of the plurality of first memory cells MC1 by applying the first charge removing voltage pulse CRP1 between the common source line CSL and the word line WL of each of the plurality of first memory cells MC1. The first charge removing operation is, for example, to apply the first charge removing voltage pulse CRP1 to the gate insulating layer of each of the plurality of first memory cells MC1 by applying the first charge removing voltage pulse CRP1 between the first semiconductor layer 10*a* and the word line WL of each of the plurality of first memory cells MC1.

The first charge removing operation is, for example, to apply the first charge removing voltage pulse CRP1 between the common source line CSL and the word line WL of each of the plurality of second memory cells MC2. The first charge removing operation is, for example, to apply the first charge removing voltage pulse CRP1 between the second semiconductor layer 10_b_ and the word line WL of each of the plurality of second memory cells MC2 by applying the first charge removing voltage pulse CRP1 between the common source line CSL and the word line WL of each of the plurality of second memory cells MC2. The first charge removing operation is, for example, to apply the first charge removing voltage pulse CRP1 to the gate insulating layer of each of the plurality of second memory cells MC2 by applying the first charge removing voltage pulse CRP1 between the second semiconductor layer 10_b_ and the word line WL of each of the plurality of second memory cells MC2.

The first charge removing voltage pulse CRP1 has a first charge removing voltage Vremove1 with a second polarity and an absolute value, which is equal to or more than the absolute value of the erase voltage Verase, and a fourth pulse width w4.

The first charge removing voltage pulse CRP1 is an example of the fourth voltage pulse. The first charge removing voltage Vremove1 is an example of the fourth voltage.

The fourth pulse width w4 is, for example, larger than the second pulse width w2.

For example, immediately after the first recovery operation, the peripheral circuit 120 and the controller 200 can perform the first charge removing operation. For example, after the first recovery operation, the peripheral circuit 120 and the controller 200 can perform the first charge removing operation without performing a write operation on any of the plurality of first memory cells MC1 and the plurality of second memory cells MC2.

For example, after the first recovery operation, the peripheral circuit 120 and the controller 200 can perform the first charge removing operation without applying a voltage pulse between the word line WL and the bit line BL of any of the plurality of first memory cells MC1 and the plurality of second memory cells MC2. For example, after the first recovery operation, the peripheral circuit 120 and the controller 200 can perform the first charge removing operation without applying a voltage pulse to the gate insulating layer of any of the plurality of first memory cells MC1 and the plurality of second memory cells MC2.

In addition, the peripheral circuit 120 and the controller 200 can determine whether or not the number of times the erase operation has been performed on the plurality of first memory cells MC1 and the plurality of second memory cells MC2 has reached a second predetermined number of times. Specifically, the judgement circuit 211 of the controller 200 determines whether or not the number of times of execution of the erase operation on the plurality of first memory cells MC1 and the plurality of second memory cells MC2 has reached a second predetermined number of times based on the number of times of execution of the erase operation stored in the built-in memory 220 and the second predetermined number of times for the erase operation stored in the built-in memory 220.

When it is determined that the number of times of execution of the erase operation has reached the second predetermined number of times, the peripheral circuit 120 and the controller 200 can perform a second recovery operation on the plurality of first memory cells MC1 and the plurality of second memory cells MC2.

The second recovery operation is, for example, to apply a second recovery voltage pulse RP2 between the bit line BL and the word line WL of each of the plurality of first memory cells MC1. The second recovery operation is, for example, to apply the second recovery voltage pulse RP2 between the first semiconductor layer 10_a_ and the word line WL of each of the plurality of first memory cells MC1 by applying the second recovery voltage pulse RP2 between the bit line BL and the word line WL of each of the plurality of first memory cells MC1. The second recovery operation is, for example, to apply the second recovery voltage pulse RP2 to the gate insulating layer of each of the plurality of first memory cells MC1 by applying the second recovery voltage pulse RP2 between the first semiconductor layer 10_a_ and the word line WL of each of the plurality of first memory cells MC1.

In the second recovery operation, the application of the second recovery voltage pulse RP2 between the common source line CSL and the word line WL of each of the plurality of first memory cells MC1 is performed simultaneously for the plurality of first memory cells MC1, for example. In the second recovery operation, the application of the second recovery voltage pulse RP2 between the common source line CSL and the word line WL of each of the plurality of first memory cells MC1 is performed, for example, for each group obtained by dividing the plurality of first memory cells MC1 into a plurality of groups.

In addition, the second recovery operation is, for example, to apply the second recovery voltage pulse RP2 between the bit line BL and the word line WL of each of the plurality of second memory cells MC2. The second recovery operation is, for example, to apply the second recovery voltage pulse RP2 between the second semiconductor layer 10_b_ and the word line WL of each of the plurality of second memory cells MC2 by applying the second recovery voltage pulse RP2 between the bit line BL and the word line WL of each of the plurality of second memory cells MC2. The second recovery operation is, for example, to apply the second recovery voltage pulse RP2 to the gate insulating layer of each of the plurality of second memory cells MC2 by applying the second recovery voltage pulse RP2 between the second semiconductor layer 10_b_ and the word line WL of each of the plurality of second memory cells MC2. In the second recovery operation, the application of the second recovery voltage pulse RP2 between the common source line CSL and the word line WL of each of the plurality of second memory cells MC2 is performed simultaneously for the plurality of second memory cells MC2, for example. In the second recovery operation, the application of the second recovery voltage pulse RP2 between the common source line CSL and the word line WL of each of the plurality of second memory cells MC2 is performed, for example, for each group obtained by dividing the plurality of second memory cells MC2 into a plurality of groups.

The second recovery voltage pulse RP2 has a second recovery voltage Vrecovery2 with a first polarity and an absolute value, which is equal to or more than the absolute value of the write voltage Vwrite, and a third pulse width w3 larger than the first pulse width w1. For example, the second recovery voltage Vrecovery2 is equal to the first recovery voltage Vrecovery1.

In addition, the peripheral circuit 120 and the controller 200 can perform a second charge removing operation on the plurality of first memory cells MC1 and the plurality of second memory cells MC2 after the second recovery operation.

The second charge removing operation is, for example, to apply a second charge removing voltage pulse CRP2 between the common source line CSL and the word line WL of each of the plurality of first memory cells MC1. The second charge removing operation is, for example, to apply the second charge removing voltage pulse CRP2 between the first semiconductor layer 10*a* and the word line WL of each of the plurality of first memory cells MC1 by applying the second charge removing voltage pulse CRP2 between the common source line CSL and the word line WL of each of the plurality of first memory cells MC1. The second charge removing operation is, for example, to apply the second charge removing voltage pulse CRP2 to the gate insulating layer of each of the plurality of first memory cells MC1 by applying the second charge removing voltage pulse CRP2 between the first semiconductor layer 10*a* and the word line WL of each of the plurality of first memory cells MC1.

The second charge removing operation is, for example, to apply the second charge removing voltage pulse CRP2 between the common source line CSL and the word line WL of each of the plurality of second memory cells MC2. The second charge removing operation is, for example, to apply the second charge removing voltage pulse CRP2 between the second semiconductor layer 10*b* and the word line WL of each of the plurality of second memory cells MC2 by applying the second charge removing voltage pulse CRP2 between the common source line CSL and the word line WL of each of the plurality of second memory cells MC2. The second charge removing operation is, for example, to apply the second charge removing voltage pulse CRP2 to the gate insulating layer of each of the plurality of second memory cells MC2 by applying the second charge removing voltage pulse CRP2 between the second semiconductor layer 10*b* and the word line WL of each of the plurality of second memory cells MC2.

The second charge removing voltage pulse CRP2 has a second charge removing voltage Vremove2 with a second polarity and an absolute value, which is equal to or more than the absolute value of the erase voltage Verase, and a fourth pulse width w4. For example, the second charge removing voltage Vremove2 is equal to the first charge removing voltage Vremove1.

Next, a method for controlling a semiconductor memory device according to the first embodiment will be described with reference to FIG. 7. Hereinafter, a case where the first polarity is a polarity in which the word line WL has a positive voltage with respect to the common source line CSL or the bit line BL and the second polarity is a polarity in which the word line WL has a negative voltage with respect to the common source line CSL or the bit line BL will be described as an example. In other words, hereinafter, a case where the first polarity is a polarity in which the word line WL has a positive voltage with respect to the semiconductor layer 10 and the second polarity is a polarity in which the word line WL has a negative voltage with respect to the semiconductor layer 10 will be described as an example.

For example, a write operation is performed on the first memory cell MC1b selected from the first memory cells MC1a to MC1d. In the write operation on the first memory cell MC1b, the write voltage pulse WP is applied to the gate insulating layer 11 of the first memory cell MC1b. The write voltage pulse WP has a write voltage Vwrite with a first polarity and a first pulse width w1.

The write voltage pulse WP is an example of the first voltage pulse. The write voltage Vwrite is an example of the first voltage.

Specifically, for example, 20 V is applied to the word line WL2. In addition, the bit line BL electrically connected to the first semiconductor layer 10*a* is fixed at, for example, a ground electric potential. The word line WL2 is at 20 V, the first semiconductor layer 10*a* is at 0 V, and the write voltage Vwrite of 20 V is applied to the gate insulating layer 11 of the first memory cell MC1b.

By the write operation, data is written into the first memory cell MC1b. By the write operation, for example, electrons are stored in the charge storage layer 16 of the first memory cell MC1b to write data.

Then, an erase operation is performed on the first memory cells MC1a to MC1d. The erase operation is to apply the erase voltage pulse EP1 to the gate insulating layer of each of the first memory cells MC1a to MC1d. The erase voltage pulse EP1 has an erase voltage Verase with a second polarity and a second pulse width w2.

The erase voltage Verase is an example of the second voltage. The erase voltage pulse EP1 is an example of the second voltage pulse.

Specifically, for example, the word lines WL1 to WL4 are fixed at the ground electric potential. In addition, 20 V is applied to the common source line CSL. The word lines WL1 to WL4 are at 0 V, the first semiconductor layer 10*a* is at 20 V, and the erase voltage Verase of 20 V is applied to the gate insulating layer 11 of each of the first memory cells MC1a to MC1d.

By the erase operation, the data in the first memory cells MC1a to MC1d is erased. By the erase operation, for example, electrons stored in the charge storage layer 16 of each of the first memory cells MC1a to MC1d are extracted to the semiconductor layer 10 side, so that the data in the first memory cells MC1a to MC1d is erased.

In addition, the erase operation is performed in units of memory blocks MBi. Therefore, the erase operation is simultaneously performed on the memory cells MC belonging to the second memory string MS2 belonging to the same memory block MBi as the first memory string MS1. That is, the erase operation on the second memory cells MC2a to MC2d is also performed at the same time as the erase operation on the first memory cells MC1a to MC1d.

Each time the erase operation is performed on the first memory cells MC1a to MC1d, the number of times of execution of the erase operation is recorded. Then, each time the erase operation is performed, it is determined whether or not the number of times of execution of the erase operation has reached a predetermined number of times (x times in FIG. 7).

In addition, a data write operation on the first memory cells MC1a to MC1d may be performed between the erase operation and the next erase operation. In addition, a data read operation on the first memory cells MC1a to MC1d may be performed between the erase operation and the next erase operation. FIG. 7 illustrates a case where a write operation on the first memory cell MC1d is performed between the first erase operation and the second erase operation.

When it is determined that the number of times of execution of the erase operation has reached a first predetermined number of times (x times in FIG. 7), a first recovery operation is performed on the first memory cells MC1a to MC1d. The first recovery operation is an example of the first processing.

The first recovery operation is to apply the first recovery voltage pulse RP1 to the gate insulating layer of each of the first memory cells MC1a to MC1d. The first recovery voltage pulse RP1 has a first recovery voltage Vrecovery1 with a first polarity and a third pulse width w3.

The first recovery voltage pulse RP1 is an example of the third voltage pulse. The first recovery voltage Vrecovery1 is an example of the third voltage.

The absolute value of the first recovery voltage Vrecovery1 is equal to or more than the absolute value of the write voltage Vwrite.

In addition, the third pulse width w3 is larger than the first pulse width w1. The third pulse width w3 is, for example, 10 times or greater than the first pulse width. In addition, the third pulse width w3 is, for example, larger than the second pulse width w2. The third pulse width w3 is, for example, equal to or more than 10 msec and equal to or less than 1 sec.

Specifically, for example, 20 V is applied to the word lines WL1 to WL4. In addition, the bit line BL is fixed at the ground electric potential. The word lines WL1 to WL4 are at 20 V, the first semiconductor layer 10*a* is at 0 V, and the first recovery voltage Vrecovery1 of 20 V is applied to the gate insulating layer 11 of each of the first memory cells MC1a to MC1d.

By the first recovery operation, the trap level generated in the tunnel insulating layer 14 of each of the first memory cells MC1a to MC1d is reduced to recover the state of the tunnel insulating layer 14. In addition, by the first recovery operation, electrons are stored in the charge storage layer 16 of each of the first memory cells MC1a to MC1d.

The first recovery operation is performed, for example, immediately after the erase operation. The first recovery operation is performed after the erase operation without performing a write operation or a read operation on the first memory cells MC1a to MC1d.

In addition, the first recovery operation is performed in units of memory blocks MBi, for example. In this case, the first recovery operation is simultaneously performed on the memory cells MC belonging to the second memory string MS2 belonging to the same memory block MBi as the first memory string MS1. That is, the first recovery operation on the second memory cells MC2a to MC2d is also performed at the same time as the first recovery operation on the first memory cells MC1a to MC1d.

In the first recovery operation, for example, the application of the first recovery voltage pulse RP1 to the first memory cells MC1a to MC1d is performed simultaneously for the first memory cells MC1a to MC1d. In addition, in the first recovery operation, for example, the application of the first recovery voltage pulse RP1 to the first memory cells MC1a to MC1d is performed for each group obtained by dividing the first memory cells MC1a to MC1d into a plurality of groups.

When it is determined that the number of times of execution of the erase operation has not reached the first predetermined number of times (x times in FIG. 7), the first recovery operation is not performed. For example, a write operation or a read operation on the first memory cell MC1a to MC1d is performed until the next erase operation.

Then, a first charge removing operation is performed on the first memory cells MC1a to MC1d. The first charge removing operation is an example of the second processing.

The first charge removing operation is to apply the first charge removing voltage pulse CRP1 to the gate insulating layer of each of the first memory cells MC1a to MC1d. The first charge removing voltage pulse CRP1 has a first charge removing voltage Vremove1 with a second polarity and a fourth pulse width w4.

The first charge removing voltage pulse CRP1 is an example of the fourth voltage pulse. The first charge removing voltage Vremove1 is an example of the fourth voltage.

The absolute value of the first charge removing voltage Vremove1 is equal to or more than the absolute value of the erase voltage Verase. The fourth pulse width w4 is, for example, equal to or more than the second pulse width w2.

Specifically, for example, the word lines WL1 to WL4 are fixed at the ground electric potential. In addition, 20V is applied to the common source line CSL. The word lines WL1 to WL4 are at 0 V, the first semiconductor layer 10*a* is at 20 V, and the first charge removing voltage Vremove1 of 20 V is applied to the gate insulating layer 11 of each of the first memory cells MC1a to MC1d.

By the first charge removing operation, electrons stored in the charge storage layer 16 of each of the first memory cells MC1a to MC1d are removed. By the first charge removing operation, for example, electrons stored in the charge storage layer 16 of each of the first memory cells MC1a to MC1d are extracted to the semiconductor layer 10 side. As a result, a state similar to that in which the data in the first memory cells MC1a to MC1d has been erased is achieved.

The first charge removing operation is performed, for example, immediately after the first recovery operation. The first charge removing operation is performed after the first recovery operation without performing a write operation or a read operation on the first memory cells MC1a to MC1d.

In addition, the first charge removing operation is performed in units of memory blocks MBi. Therefore, the first charge removing operation is simultaneously performed on the memory cells MC belonging to the second memory string MS2 belonging to the same memory block MBi as the first memory string MS1. That is, the first charge removing operation on the second memory cells MC2a to MC2d is also performed at the same time as the first charge removing operation on the first memory cells MC1a to MC1d.

After the first charge removing operation, for example, a write operation or a read operation on the first memory cells MC1a to MC1d is performed. In addition, the erase operation on the first memory cells MC1a to MC1d is repeatedly performed. The application of the erase voltage pulse EP to the first memory cells MC1a to MC1d is repeatedly performed.

After the first charge removing operation, when it is determined that the number of times of execution of the erase operation has reached the second predetermined number of times (2x times in FIG. 7), a second recovery operation on the first memory cells MC1a to MC1d is performed. The second recovery operation is to apply the second recovery voltage pulse RP2 to the gate insulating layer of each of the first memory cells MC1a to MC1d. The second recovery voltage pulse RP2 has a second recovery voltage Vrecovery2 with a first polarity and a third pulse width w3.

For example, the second recovery voltage Vrecovery2 is equal to the first recovery voltage Vrecovery1.

In the second recovery operation, for example, the application of the second recovery voltage pulse RP2 to the first memory cells MC1a to MC1d is performed simultaneously for the first memory cells MC1a to MC1d. In addition, in the second recovery operation, for example, the application of the second recovery voltage pulse RP2 to the first memory cells MC1a to MC1d is performed for each group obtained by dividing the first memory cells MC1a to MC1d into a plurality of groups.

Then, a second charge removing operation is performed on the first memory cells MC1a to MC1d. The second charge removing operation is to apply the second charge removing voltage pulse CRP2 to the gate insulating layer of each of the first memory cells MC1a to MC1d. The second charge removing voltage pulse CRP2 has a second charge removing voltage Vremove2 with a second polarity and a fourth pulse width w4.

For example, the second charge removing voltage Vremove2 is equal to the first charge removing voltage Vremove1.

After the second charge removing operation, for example, a write operation or a read operation on the first memory cells MC1a to MC1d is performed. In addition, the erase operation on the first memory cells MC1a to MC1d is repeatedly performed. The application of the erase voltage pulse EP to the first memory cells MC1a to MC1d is repeatedly performed.

Next, the function and effect of the semiconductor memory device and the method for controlling a semiconductor memory device according to the first embodiment will be described.

In a nonvolatile semiconductor memory device in which a field effect transistor is used as a memory cell, the threshold voltage of the field effect transistor may fluctuate. For example, in a three-dimensional NAND flash memory, the threshold voltage of a memory cell transistor may fluctuate due to repeated erase operation on the memory cell. When the threshold voltage of the memory cell transistor fluctuates, for example, a malfunction may occur in a write operation on the memory cell or a read operation on the memory cell. Due to fluctuations in the threshold voltage of the memory cell transistor, the reliability of the three-dimensional NAND flash memory is reduced.

Figure 8:
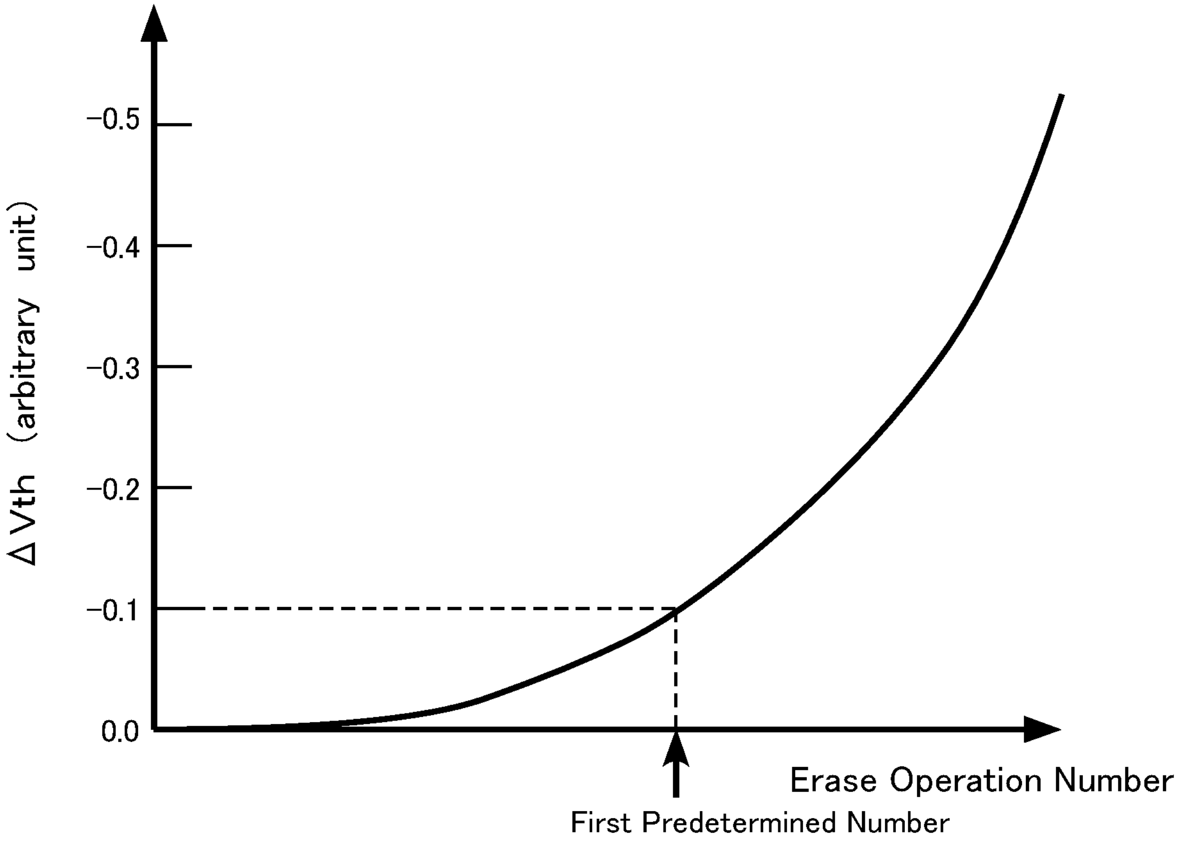
FIG. 8 is an explanatory diagram of the function and effect of the semiconductor memory device and the method for controlling a semiconductor memory device according to the first embodiment.
Figure 9:
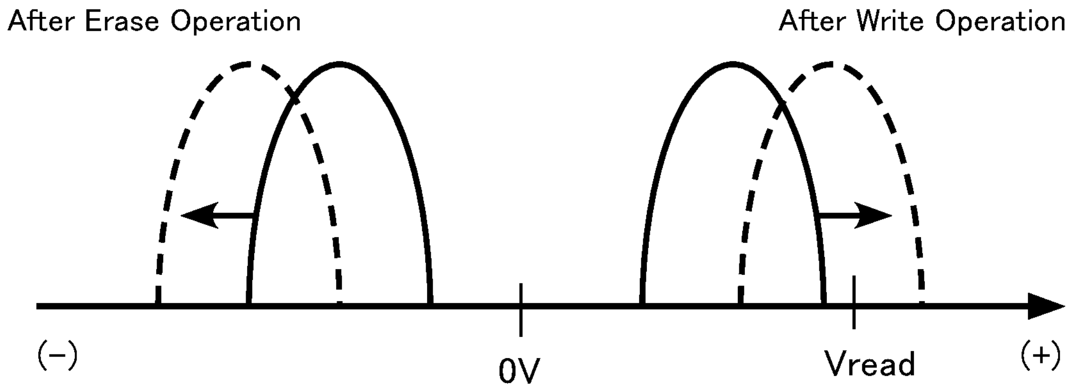
FIG. 9 is an explanatory diagram of the function and effect of the semiconductor memory device and the method for controlling a semiconductor memory device according to the first embodiment.

FIGS. 8 and 9 are explanatory diagrams of the function and effect of the semiconductor memory device and the method for controlling a semiconductor memory device according to the first embodiment.

FIG. 8 is a diagram showing fluctuations in the threshold voltage of a memory cell transistor when an erase operation is repeated on a memory cell. In addition, FIG. 9 is an explanatory diagram of fluctuations in the threshold voltage of the memory cell transistor.

For example, a case is considered in which the voltage applied to the gate electrode layer is a negative voltage during an erase operation on a memory cell. As shown in FIG. 8, as the erase operation on the memory cell is repeated, the threshold voltage of the memory cell transistor after the erase operation changes to the negative side. In other words, the threshold voltage of the memory cell transistor after the erase operation is reduced.

The inventors' study revealed that fluctuations in the threshold voltage of the memory cell transistor when the erase operation was repeated were caused by the trap level formed in the tunnel insulating layer containing silicon (Si), nitrogen (N), and oxygen (O) of the memory cell. A trap level is formed in the tunnel insulating layer due to the voltage stress applied during the erase operation. It is thought that the threshold voltage of the memory cell transistor after the erase operation is reduced because holes are trapped in the trap level of the tunnel insulating layer during the erase operation.

By repeating the erase operation, the trap level of the tunnel insulating layer increases. Therefore, by repeating the erase operation, the amount of holes trapped also increases. As a result, as shown in FIG. 8, the amount of decrease in the threshold voltage of the memory cell transistor after the erase operation also increases.

As shown in FIG. 9, the threshold voltage of the memory cell transistor after the erase operation on the memory cell changes to the negative side. A case is considered in which a write operation is performed on a memory cell whose threshold voltage has changed to the negative side. Since the threshold voltage changes to the negative side, when a positive write voltage Vwrite is applied to the gate electrode layer of the memory cell, the electric field strength applied to the gate insulating layer increases.

Therefore, the amount of electrons stored in the charge storage layer increases. As a result, as shown in FIG. 9, the threshold voltage of the memory cell transistor after the write operation changes to the positive side. In other words, the threshold voltage of the memory cell transistor after the write operation increases.

In a three-dimensional NAND flash memory, when a read operation is performed on a selected memory cell, a read voltage Vread higher than the threshold voltages of all memory cells is applied to the gate electrode layer of an unselected memory cell belonging to the same memory string as the selected memory cell. By applying the read voltage Vread to the gate electrode layer of the unselected memory cell, the channel resistance of the unselected memory cell is reduced, making it possible to read data from the selected memory cell.

However, as shown in FIG. 9, when the threshold voltage of the memory cell transistor increases after the write operation, even if the read voltage Vread is applied to the gate electrode layer of the unselected memory cell, the memory cell transistor of the unselected memory cell may not be turned on. Alternatively, even if the read voltage Vread is applied to the gate electrode layer of the unselected memory cell, the channel resistance of the unselected memory cell may not be sufficiently reduced.

If the memory cell transistor of the unselected memory cell is not turned on or the channel resistance of the unselected memory cell is not sufficiently reduced, there is a possibility that data may not be read from the selected memory cell. In other words, a malfunction may occur in the read operation of the memory cell.

The semiconductor memory device according to the first embodiment includes a control circuit that can perform a first recovery operation on the memory cell MC. After the erase operation on the memory cell MC is performed the first predetermined number of times, the first recovery operation is performed to reduce the trap level generated in the tunnel insulating layer 14 containing silicon (Si), nitrogen (N), and oxygen (O).

By reducing the trap level generated in the tunnel insulating layer 14, the amount of holes trapped in the tunnel insulating layer 14 after the erase operation is reduced. Therefore, a decrease in the threshold voltage of the memory cell transistor after the erase operation can be suppressed. Therefore, an increase in the threshold voltage of the memory cell transistor after the write operation is also suppressed, and malfunctions in the read operation of the memory cell are suppressed. As a result, the reliability of the three-dimensional NAND flash memory is improved.

In addition, the first predetermined number of times of execution of the erase operation, which determines the timing of execution of the first recovery operation, is determined based on the amount of fluctuation in the threshold voltage that is allowed for the operation of the memory cell MC. For example, FIG. 8 shows a case where the number of times of execution when the amount of fluctuation in the threshold voltage is −0.1 is set to the first predetermined number of times.

Since the absolute value of the first recovery voltage Vrecovery1 is equal to or more than the absolute value of the write voltage Vwrite, it is possible to reduce the trap level generated in the tunnel insulating layer 14. From the viewpoint of reducing the trap level generated in the tunnel insulating layer 14, it is preferable that the absolute value of the first recovery voltage Vrecovery1 is larger than the absolute value of the write voltage Vwrite.

In addition, since the third pulse width w3 is larger than the first pulse width w1, it is possible to reduce the trap level generated in the tunnel insulating layer 14.

The third pulse width w3 is preferably equal to or more than 10 msec and equal to or less than 1 sec, and more preferably equal to or more than 50 msec and equal to or less than 500 msec. Since the third pulse width w3 is larger than the lower limit value described above, the trap level generated in the tunnel insulating layer 14 can be further reduced. In addition, since the third pulse width w3 is smaller than the upper limit value described above, the generation of a trap level in the tunnel insulating layer 14 is suppressed due to the voltage stress of the first recovery operation.

The third pulse width w3 is preferably 10 times or greater than the first pulse width w1 and 1000 times or less than the first pulse width w1. When the third pulse width w3 is larger than the lower limit value described above, the trap level generated in the tunnel insulating layer 14 can be further reduced. In addition, when the third pulse width w3 is smaller than the upper limit value described above, the generation of a trap level in the tunnel insulating layer 14 is suppressed due to the voltage stress of the first recovery operation.

From the viewpoint of further reducing the trap level generated in the tunnel insulating layer 14, it is preferable that the third pulse width w3 is larger than the second pulse width w2.

From the viewpoint of simplifying the operation sequence of the three-dimensional NAND flash memory 100, it is preferable that the first recovery operation is performed immediately after the erase operation. The first recovery operation is preferably performed after the erase operation, for example, without performing a write operation or a read operation on the first memory cells MC1a to MC1d.

By the first recovery operation, electrons are stored in the charge storage layer 16 of each of the first memory cells MC1a to MC1d. By performing the first charge removing operation on the first memory cells MC1a to MC1d, the electrons stored in the charge storage layer 16 of each of the first memory cells MC1a to MC1d are removed. As a result, a state similar to that in which the data in the first memory cells MC1a to MC1d has been erased is achieved.

Since the absolute value of the first charge removing voltage Vremove1 is equal to or more than the absolute value of the erase voltage Verase, it is possible to remove the electrons stored in the charge storage layer 16. From the viewpoint of further removing the electrons stored in the charge storage layer 16, it is preferable that the absolute value of the first charge removing voltage Vremove1 is larger than the absolute value of the erase voltage Verase.

From the viewpoint of further removing the electrons stored in the charge storage layer 16, it is preferable that the fourth pulse width w4 is equal to or more than the second pulse width w2. From the viewpoint of further removing the electrons stored in the charge storage layer 16, it is more preferable that the fourth pulse width w4 is larger than the second pulse width w2.

From the viewpoint of simplifying the operation sequence of the three-dimensional NAND flash memory 100, it is preferable that the first charge removing operation is performed immediately after the first recovery operation. The first charge removing operation is preferably performed after the first recovery operation, for example, without performing a write operation or a read operation on the first memory cells MC1a to MC1d.

As described above, according to the first embodiment, fluctuations in the threshold voltage of the memory cell transistor are suppressed, so that it is possible to realize a highly reliable semiconductor memory device.

Second Embodiment

A semiconductor memory device according to a second embodiment is different from the semiconductor memory device according to the first embodiment in that the control circuit is configured to determine whether or not the number of times of execution of the erase operation on the plurality of first memory cells after the second processing has reached a second predetermined number of times, the control circuit is configured perform third processing on the plurality of first memory cells when it is determined that the number of times of execution has reached the second predetermined number of times and in the third processing configured to apply a fifth voltage pulse having a fifth voltage with the first polarity and an absolute value equal to or more than the absolute value of the first voltage and a fifth pulse width larger than the third pulse width between each of the gate electrode layers of the plurality of first memory cells and at least one of the first wiring or the second wiring, and the control circuit is configured to perform fourth processing on the plurality of first memory cells after the third processing and in the fourth processing configured to apply a sixth voltage pulse having a sixth voltage with the second polarity and an absolute value equal to or more than the absolute value of the second voltage and a sixth pulse width between each of the gate electrode layers of the plurality of first memory cells and at least one of the first wiring or the second wiring. Hereinafter, the description of a part of the content overlapping the first embodiment may be omitted.

The semiconductor memory device according to the second embodiment includes a three-dimensional NAND flash memory. The memory cell of the semiconductor memory device according to the second embodiment is a so-called MONOS type memory cell. The three-dimensional NAND flash memory according to the second embodiment has the same structure as the three-dimensional NAND flash memory 100 according to the first embodiment.

Figure 10:
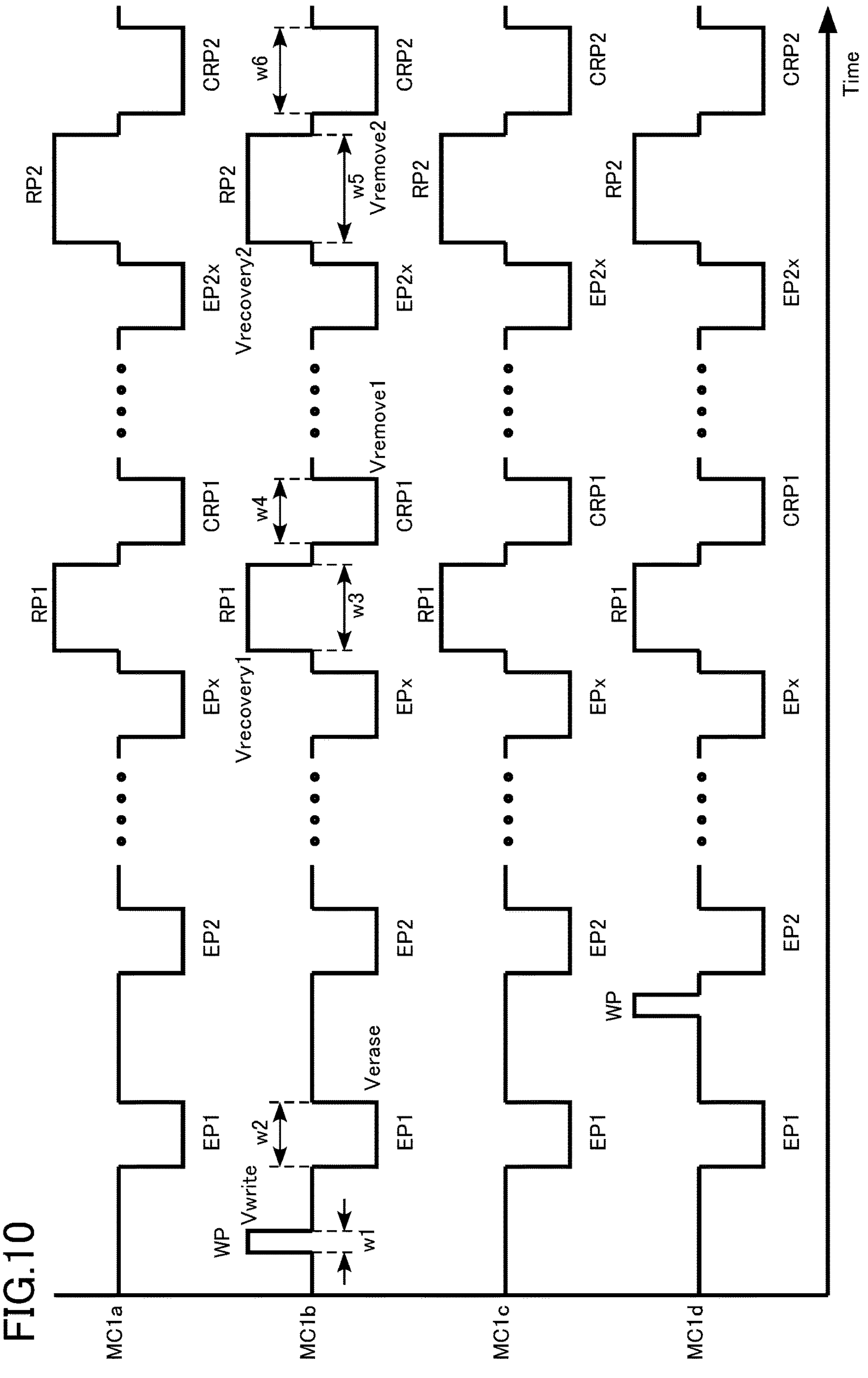
FIG. 10 is a timing chart illustrating the control of a semiconductor memory device according to a second embodiment.

FIG. 10 is a timing chart illustrating the control of the semiconductor memory device according to the second embodiment. FIG. 10 shows a voltage pulse applied to the gate insulating layer 11 of each of the first memory cells MC1a to MC1d included in the first memory string MS1.

After the first recovery operation, the peripheral circuit 120 and the controller 200 of the three-dimensional NAND flash memory according to the second embodiment can determine whether or not the number of times of execution of the erase operation on the plurality of first memory cells MC1 and the plurality of second memory cells MC2 has reached the second predetermined number of times. Specifically, the judgement circuit 211 of the controller 200 determines whether or not the number of times of execution of the erase operation on the plurality of first memory cells MC1 and the plurality of second memory cells MC2 has reached the second predetermined number of times based on the number of times of execution of the erase operation stored in the built-in memory 220 and the second predetermined number of times for the erase operation stored in the built-in memory 220.

In addition, when it is determined that the number of times of execution of the erase operation has reached the second predetermined number of times (2× times in FIG. 10), the peripheral circuit 120 and the controller 200 can perform a second recovery operation on the plurality of first memory cells MC1 and the plurality of second memory cells MC2. The second recovery operation is an example of the third processing.

The second recovery operation is, for example, to apply the second recovery voltage pulse RP2 to the gate insulating layer of each of the plurality of first memory cells MC1 and the plurality of second memory cells MC2. The second recovery voltage pulse RP2 has a second recovery voltage Vrecovery2 with a first polarity and an absolute value, which is equal to or more than the absolute value of the write voltage Vwrite, and a fifth pulse width w5 larger than the third pulse width w3.

The second recovery voltage pulse RP2 is an example of the fifth voltage pulse. The second recovery voltage Vrecovery2 is an example of the fifth voltage.

In addition, the peripheral circuit 120 and the controller 200 can perform a second charge removing operation on the plurality of first memory cells MC1 and the plurality of second memory cells MC2 after the second recovery operation. The second charge removing operation is an example of the fourth processing.

The second charge removing operation is, for example, to apply the second charge removing voltage pulse CRP2 to the gate insulating layer of each of the plurality of first memory cells MC1 and the plurality of second memory cells MC2. The second charge removing voltage pulse CRP2 has a second charge removing voltage Vremove2 with a second polarity and an absolute value, which is equal to or more than the erase voltage Verase, and a sixth pulse width w6 larger than the fourth pulse width w4. For example, the second charge removing voltage Vremove2 is equal to the first charge removing voltage Vremove1.

The second charge removing voltage pulse CRP2 is an example of the sixth voltage pulse. The second charge removing voltage Vremove2 is an example of the sixth voltage.

In the method for controlling a three-dimensional NAND flash memory according to the second embodiment, after the first charge removing operation, for example, a write operation or a read operation on the first memory cells MC1a to MC1d is performed. In addition, the erase operation on the first memory cells MC1a to MC1d is repeatedly performed. The application of the erase voltage pulse EP to the first memory cells MC1a to MC1d is repeatedly performed.

When it is determined that the number of times of execution of the erase operation has reached the second predetermined number of times (2× times in FIG. 10), a second recovery operation on the first memory cells MC1a to MC1d is performed. The second recovery operation is to apply the second recovery voltage Vrecovery2 with a first polarity and the second recovery voltage pulse RP2 with a fifth pulse width w5 to the gate insulating layer of each of the first memory cells MC1a to MC1d.

The absolute value of the second recovery voltage Vrecovery2 is equal to or more than the absolute value of the first recovery voltage Vrecovery1. For example, the absolute value of the second recovery voltage Vrecovery2 is equal to the absolute value of the first recovery voltage Vrecovery1. The fifth pulse width w5 is larger than the third pulse width w3.

Then, a second charge removing operation is performed on the first memory cells MC1a to MC1d. The second charge removing operation is to apply the second charge removing voltage Vremove2 with a second polarity and the second charge removing voltage pulse CRP2 with a sixth pulse width w6 to the gate insulating layer of each of the first memory cells MC1a to MC1d.

The absolute value of the second charge removing voltage Vremove2 is equal to or more than the absolute value of the first charge removing voltage Vremove1. For example, the absolute value of the second charge removing voltage Vremove2 is equal to the absolute value of the first charge removing voltage Vremove1. The sixth pulse width w6 is, for example, larger than the fourth pulse width w4.

After the second charge removing operation, for example, a write operation or a read operation on the first memory cells MC1a to MC1d is performed. In addition, the erase operation on the first memory cells MC1a to MC1d is repeatedly performed. The application of the erase voltage pulse EP to the first memory cells MC1a to MC1d is repeatedly performed.

For example, a case is considered in which some of the trap levels generated in the tunnel insulating layer 14 remain without being recovered after the first recovery operation. In this case, if the third pulse width w3 of the first recovery operation and the fifth pulse width w5 of the second recovery operation are made equal, there is a possibility that the trap levels remaining in the tunnel insulating layer 14 after the second recovery operation will further increase than after the first recovery operation.

In the three-dimensional NAND flash memory according to the second embodiment, the fifth pulse width w5 of the second recovery operation is made larger than the third pulse width w3 of the first recovery operation. By making the fifth pulse width w5 of the second recovery operation larger than the third pulse width w3 of the first recovery operation, the trap levels remaining in the tunnel insulating layer 14 after the second recovery operation can be suppressed from increasing more than after the first recovery operation.

In the three-dimensional NAND flash memory according to the second embodiment, the fifth pulse width w5 of the second recovery operation is made larger than the third pulse width w3 of the first recovery operation. Therefore, it is conceivable that the amount of electrons stored in the charge storage layer 16 by the second recovery operation becomes larger than the amount of electrons stored in the charge storage layer 16 by the first recovery operation. In this case, if the sixth pulse width w6 of the second charge removing operation and the fourth pulse width w4 of the first charge removing operation are made equal, there is a possibility that the electrons stored in the charge storage layer 16 may not be removed sufficiently by the second charge removing operation.

In the three-dimensional NAND flash memory according to the second embodiment, it is preferable that the sixth pulse width w6 of the second charge removing operation be larger than the fourth pulse width w4 of the first charge removing operation. By making the sixth pulse width w6 of the second charge removing operation larger than the fourth pulse width w4 of the first charge removing operation, the electrons stored in the charge storage layer 16 can be sufficiently removed by the second charge removing operation.

As described above, according to the second embodiment, fluctuations in the threshold voltage of the memory cell transistor are further suppressed compared to the first embodiment, so that it is possible to realize a highly reliable semiconductor memory device.

Third Embodiment

A semiconductor memory device according to a third embodiment is different from the semiconductor memory device according to the first embodiment in that the charge storage region is a conductor. Hereinafter, the description of a part of the content overlapping the first embodiment may be omitted.

The semiconductor memory device according to the third embodiment includes a three-dimensional NAND flash memory. The memory cell of the semiconductor memory device according to the third embodiment is a so-called floating gate type memory cell.

Figure 11:
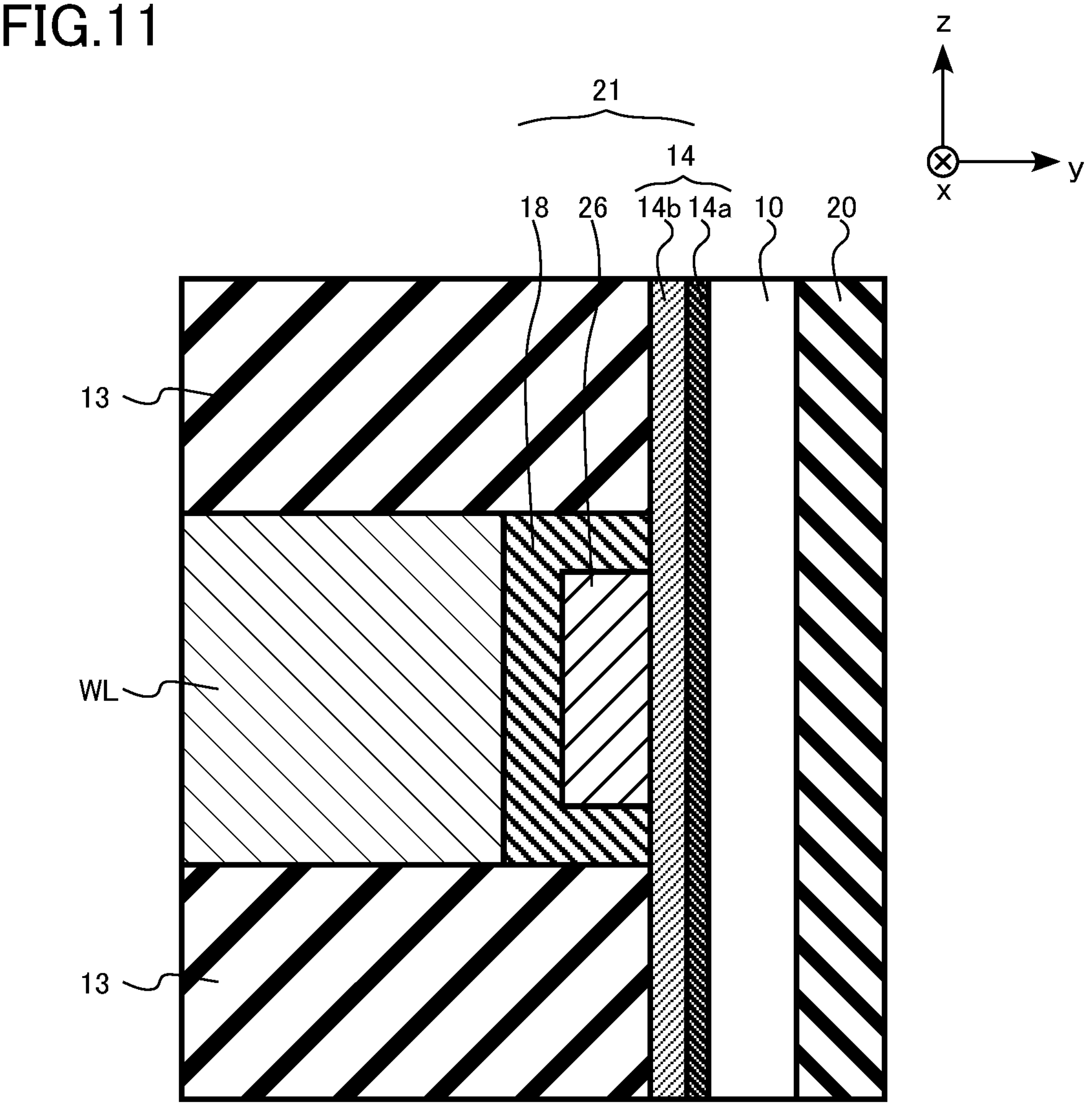
FIG. 11 is a schematic cross-sectional view of a part of a memory cell of a semiconductor memory device according to a third embodiment.

FIG. 11 is a schematic cross-sectional view of a part of a memory cell of the semiconductor memory device according to the third embodiment. FIG. 11 is a diagram corresponding to FIG. 6 in the first embodiment.

A gate insulating layer 21 includes a tunnel insulating layer 14, a charge storage layer 26, and a block insulating layer 18. The tunnel insulating layer 14 is an example of the first insulating region. The block insulating layer 18 is an example of the second insulating region. The charge storage layer 26 is an example of a charge storage region.

The tunnel insulating layer 14 contains silicon layer 14 contains, for example, silicon oxynitride. The tunnel insulating layer 14 is, for example, a silicon oxynitride layer.

The tunnel insulating layer 14 may have a stacked structure of a plurality of films. As shown in FIG. 11, the tunnel insulating layer 14 includes, for example, a stacked structure of a silicon oxide film 14*a* and a silicon oxynitride film 14*b*.

The charge storage layer 26 is provided between the tunnel insulating layer 14 and the block insulating layer 18.

The charge storage layer 26 has a function of storing charges. The charge is, for example, an electron. The threshold voltage of the memory cell transistor changes according to the amount of charges stored in the charge storage layer 26. By using the threshold voltage change, one memory cell can store data.

The charge storage layer 26 is a conductor. The charge storage layer 26 is, for example, polycrystalline silicon.

The block insulating layer 18 is provided between the tunnel insulating layer 14 and the word line WL. The block insulating layer 18 is provided between the charge storage layer 26 and the word line WL.

The block insulating layer 18 is an insulator. The block insulating layer 18 contains, for example, silicon (Si) and oxygen (O). The block insulating layer 18 contains, for example, silicon oxide. The block insulating layer 18 is, for example, a silicon oxide layer.

As described above, according to the third embodiment, as in the first embodiment, fluctuations in the threshold voltage of the memory cell transistor are suppressed, so that it is possible to realize a highly reliable semiconductor memory device.

Fourth Embodiment

A semiconductor memory device according to a fourth embodiment is different from the semiconductor memory device according to the first embodiment in that the gate insulating layer contains a ferroelectric material. Hereinafter, the description of a part of the content overlapping the first embodiment may be omitted.

The semiconductor memory device according to the fourth embodiment includes a three-dimensional ferroelectric memory. The memory cell of the semiconductor memory device according to the fourth embodiment is a Ferroelectric FET (FeFET) type three-terminal memory in which a ferroelectric layer is applied as the gate insulating layer and the threshold voltage of the transistor is modulated.

Figure 12:
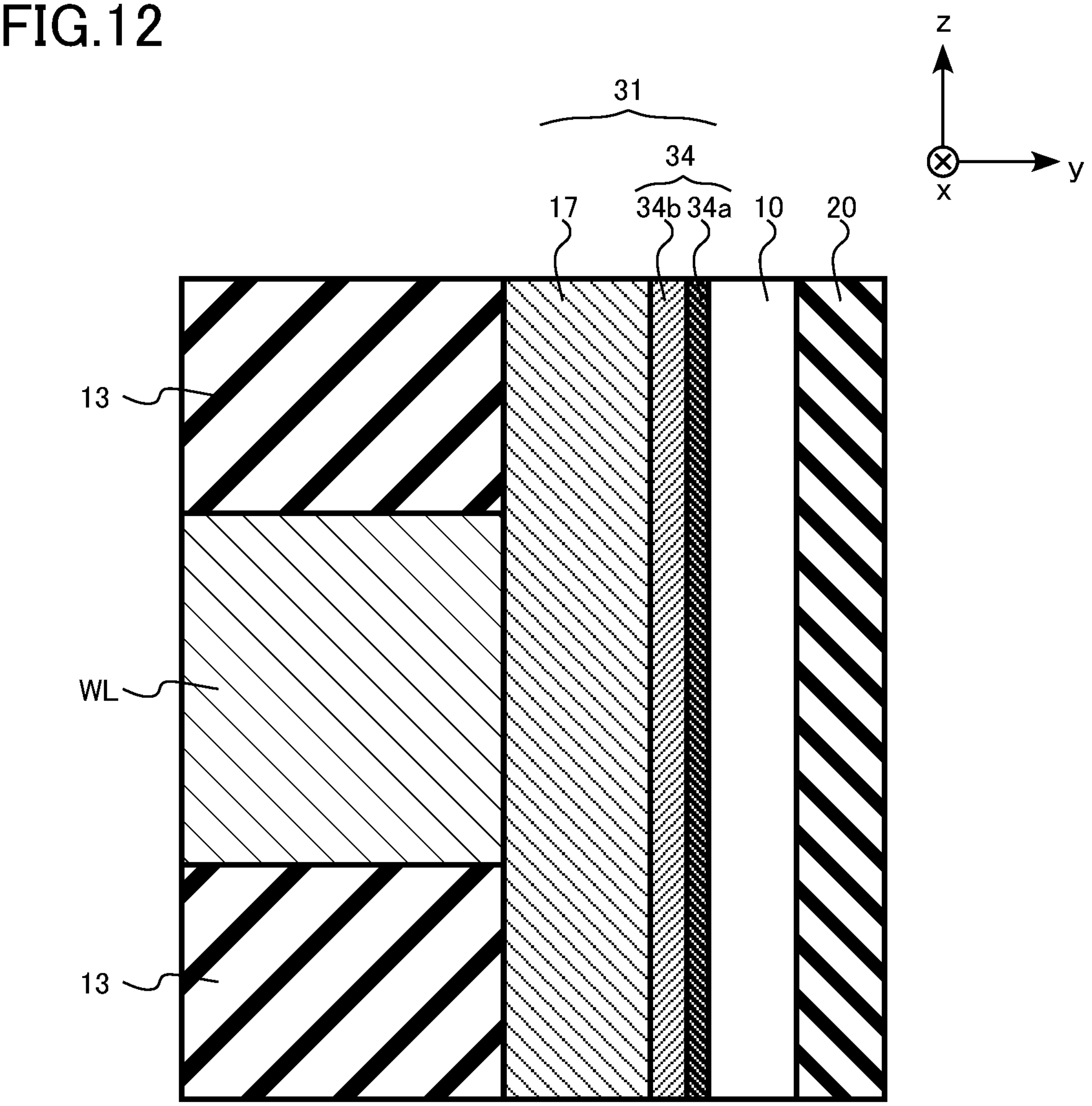
FIG. 12 is a schematic cross-sectional view of a part of a memory cell of a semiconductor memory device according to a fourth embodiment.

FIG. 12 is a schematic cross-sectional view of a part of a memory cell of the semiconductor memory device according to the fourth embodiment. FIG. 12 is a diagram corresponding to FIG. 6 in the first embodiment.

A gate insulating layer 31 includes an insulating layer 34 and a ferroelectric layer 17. The insulating layer 34 is an example of the first insulating region.

The insulating layer 34 contains silicon (Si), nitrogen (N), and oxygen (O). The insulating layer 34 contains, for example, silicon oxynitride. The insulating layer 34 is, for example, a silicon oxynitride layer.

The insulating layer 34 may have a stacked structure of a plurality of films. As shown in FIG. 12, the insulating layer 34 has, for example, a stacked structure of a silicon oxide film 34*a* and a silicon oxynitride film 34*b*.

The ferroelectric layer 17 is provided between the insulating layer 34 and the word line WL.

According to the polarization state of the ferroelectric layer 17, the threshold voltage of the memory cell transistor of the memory cell MC changes. When the threshold voltage of the memory cell transistor changes, the on-current of the memory cell transistor changes. For example, if a state in which the threshold voltage is high and the on-current is low is defined as data “0” and a state in which the threshold voltage is low and the on-current is high is defined as data “1”, the memory cell MC can store 1-bit data of “0” and “1”.

The ferroelectric layer 17 contains a ferroelectric material. The ferroelectric layer 17 is, for example, an oxide containing at least one of hafnium oxide and zirconium oxide.

As described above, according to the fourth embodiment, as in the first embodiment, fluctuations in the threshold voltage of the memory cell transistor are suppressed, so that it is possible to realize a highly reliable semiconductor memory device.

Fifth Embodiment

A semiconductor memory device according to a fifth embodiment includes a memory cell including a semiconductor layer, a gate electrode layer, and a gate insulating layer including a first insulating region containing silicon (Si), oxygen (O), and nitrogen (N) and provided between the semiconductor layer and the gate electrode layer; a first wiring and a second wiring electrically connected to the semiconductor layer; and a control circuit configured to control the memory cell. The control circuit is configured to perform a write operation on the memory cell, and in the write operation configured to apply a first voltage pulse having a first voltage with a first polarity and a first pulse width between the gate electrode layer and at least one of the first wiring or the second wiring. The control circuit is configured to perform an erase operation on the memory cell, and in the erase operation configured to apply a second voltage pulse having a second voltage with a second polarity opposite to the first polarity and a second pulse width between the gate electrode layer and at least one of the first wiring or the second wiring. The control circuit is configured to determine whether or not the number of times of execution of the erase operation on the memory cell has reached a predetermined number of times. The control circuit is configured to perform first processing on the memory cell when it is determined that the number of times of execution has reached the predetermined number of times, and in the first processing configured to apply a third voltage pulse having a third voltage with the first polarity and an absolute value equal to or more than an absolute value of the first voltage and a third pulse width larger than the first pulse width between the gate electrode layer and at least one of the first wiring or the second wiring. The control circuit is configured to perform second processing on the memory cell after the first processing, and in the second processing configured to apply a fourth voltage pulse having a fourth voltage with the second polarity and an absolute value equal to or more than an absolute value of the second voltage and a fourth pulse width between the gate electrode layer and at least one of the first wiring or the second wiring.

The semiconductor memory device according to the fifth embodiment is different from the semiconductor memory device according to the first embodiment in that the semiconductor memory device according to the fifth embodiment includes a two-dimensional NOR flash memory. Hereinafter, some descriptions of content that overlap with the first embodiment may be omitted.

The semiconductor memory device according to the fifth embodiment includes a two-dimensional NOR flash memory. The memory cell of the semiconductor memory device according to the fifth embodiment is a so-called floating gate type memory cell.

Figure 13:
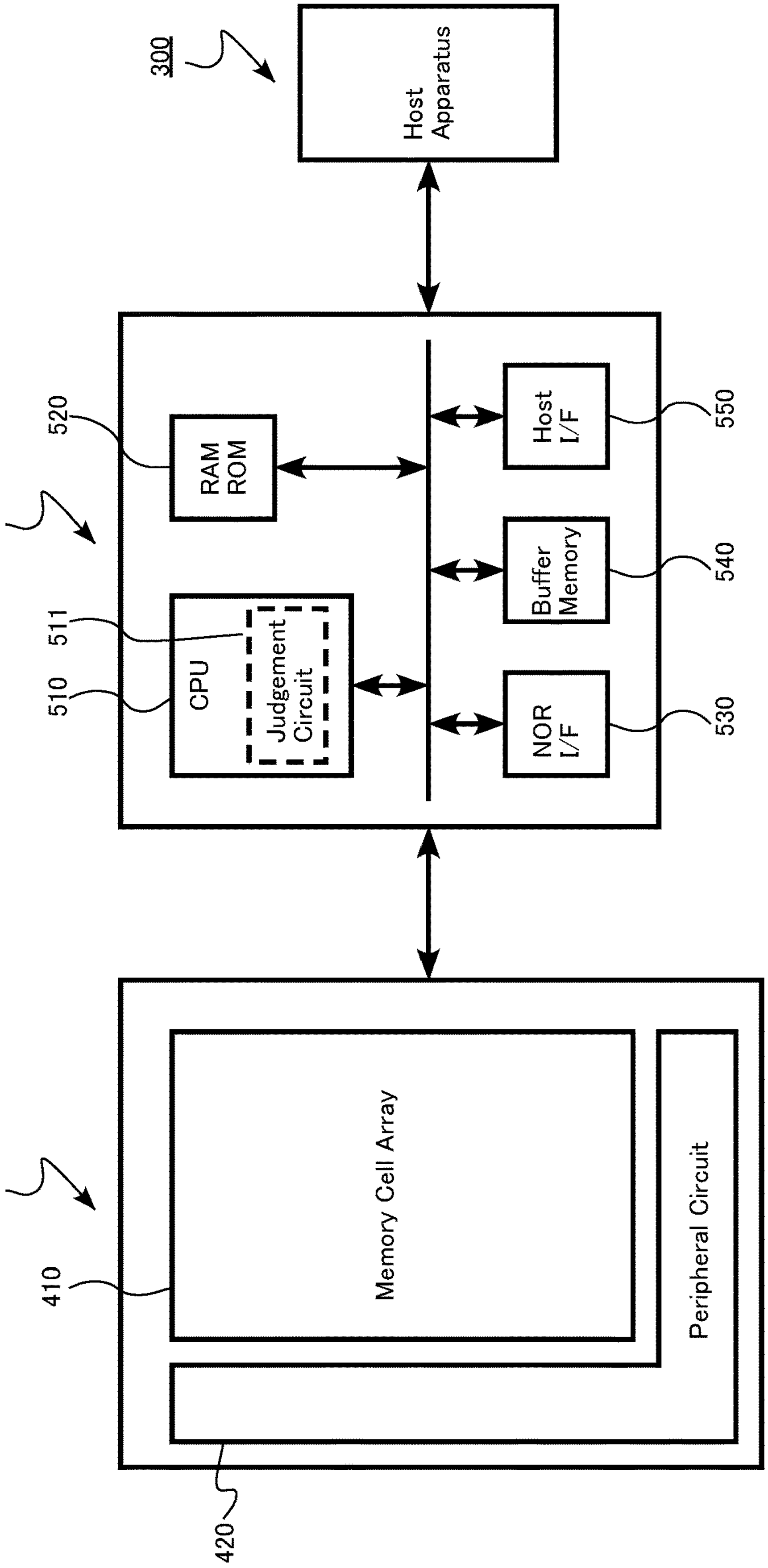
FIG. 13 is a block diagram of a memory system including a semiconductor memory device according to a fifth embodiment.

FIG. 13 is a block diagram of a memory system including the semiconductor memory device according to the fifth embodiment. The memory system according to the fifth embodiment includes, for example, a two-dimensional NOR flash memory 400, a controller 500, and a host apparatus 300. The semiconductor memory device according to the fifth embodiment includes, for example, the two-dimensional NOR flash memory 400 and the controller 500.

The two-dimensional NOR flash memory 400 is, for example, a two-dimensional NOR flash memory chip. In addition, the controller 500 is, for example, a controller chip.

As shown in FIG. 13, the two-dimensional NOR flash memory 400 includes a memory cell array 410 and a peripheral circuit 420.

The peripheral circuit 420 is provided around the memory cell array 410. For example, the peripheral circuit 420 has a function of controlling the operation of the memory cell array 410 according to an instruction received from the controller 500.

The controller 500 controls the two-dimensional NOR flash memory 400. In addition, the controller 500 accesses the two-dimensional NOR flash memory 400 in response to an instruction received from the host apparatus 300.

The peripheral circuit 420 of the two-dimensional NOR flash memory 400 and the controller 500 are examples of the control circuit in the fifth embodiment.

As shown in FIG. 13, the controller 500 includes a processor 510 (CPU), a built-in memory 520 (RAM, ROM), a NOR interface circuit 530, a buffer memory 540, and a host interface circuit 550. The processor 510 includes a judgement circuit 511.

The processor 510 controls the overall operation of the controller 500. The processor 510 has a function of performing various processes for managing the two-dimensional NOR flash memory 400. The judgement circuit 511 can determine whether or not the number of times of execution of an erase operation on a specific memory cell has reached a predetermined number of times.

The built-in memory 520 is, for example, a semiconductor memory. The built-in memory 520 is used, for example, as a work area for the processor. In addition, the built-in memory 520 stores, for example, firmware for managing the two-dimensional NOR flash memory 400 and various management tables.

The built-in memory 520 stores, for example, the number of times of execution of an erase operation on memory cells included in the two-dimensional NOR flash memory 400. In addition, the built-in memory 520 stores, for example, a predetermined number of times for the erase operation, which is a criterion for determining whether or not to perform a recovery operation. The judgement circuit 511 determines whether or not the number of times of execution of the erase operation on a specific memory cell has reached a predetermined number of times based on the number of times of execution of the erase operation and the predetermined number of times for the erase operation stored in the built-in memory 520.

The NOR interface circuit 530 is connected to the two-dimensional NOR flash memory 400 through a NOR bus. The NOR interface circuit 530 has a function of controlling communication with the two-dimensional NOR flash memory 400.

The buffer memory 540 has a function of temporarily storing data written into memory cells or data read from memory cells, for example.

The host interface circuit 550 is connected to the host apparatus 300 through a host bus. For example, the host interface circuit 550 transmits an instruction received from the host apparatus 300 to the processor 510. In addition, for example, the host interface circuit 550 transmits data received from the host apparatus 300 to the buffer memory 540. In addition, for example, the host interface circuit 550 transmits data in the buffer memory 540 to the host apparatus 300 in response to an instruction from the processor 510.

Figure 14:
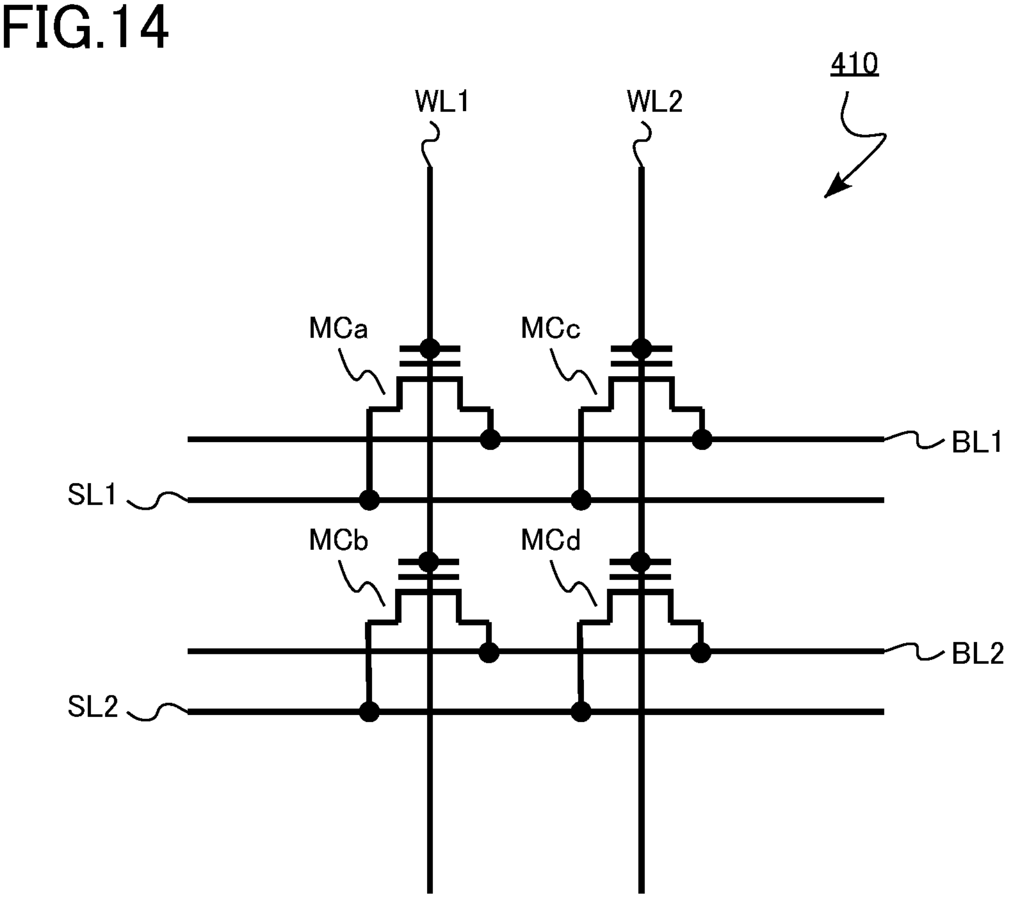
FIG. 14 is an equivalent circuit diagram of a part of a memory cell array of the semiconductor memory device according to the fifth embodiment.

FIG. 14 is an equivalent circuit diagram of a part of a memory cell array of the semiconductor memory device according to the fifth embodiment. FIG. 14 is an equivalent circuit diagram of a part of the memory cell array 410 of the two-dimensional NOR flash memory 400.

As shown in FIG. 14, the memory cell array 410 includes a plurality of memory cells MC, a plurality of source lines SL, a plurality of bit lines BL, and a plurality of word lines WL. The plurality of memory cells MC include a memory cell MCa, a memory cell MCb, a memory cell MCc, and a memory cell MCd. The plurality of source lines SL include a first source line SL1 and a second source line SL2. The plurality of bit lines BL include a first bit line BL1 and a second bit line BL2. The plurality of word lines WL include a first word line WL1 and a second word line WL2.

The plurality of word lines WL are arranged in parallel so as to be spaced from each other. The plurality of bit lines BL cross the word line WL, for example. The plurality of bit lines BL are arranged in parallel so as to be spaced from each other. The plurality of source lines SL cross the word line WL, for example. The plurality of source lines SL are arranged in parallel so as to be spaced from each other.

By selecting one source line SL, one bit line BL, and one word line WL, one memory cell MC can be selected. The word line WL is a gate electrode of a memory cell transistor forming the memory cell MC. The memory cell transistor is a field effect transistor whose operation is controlled by a voltage applied to its gate electrode.

The two-dimensional NOR flash memory 400 allows random access to a plurality of memory cells MC included in the memory cell array 410.

Figure 15:
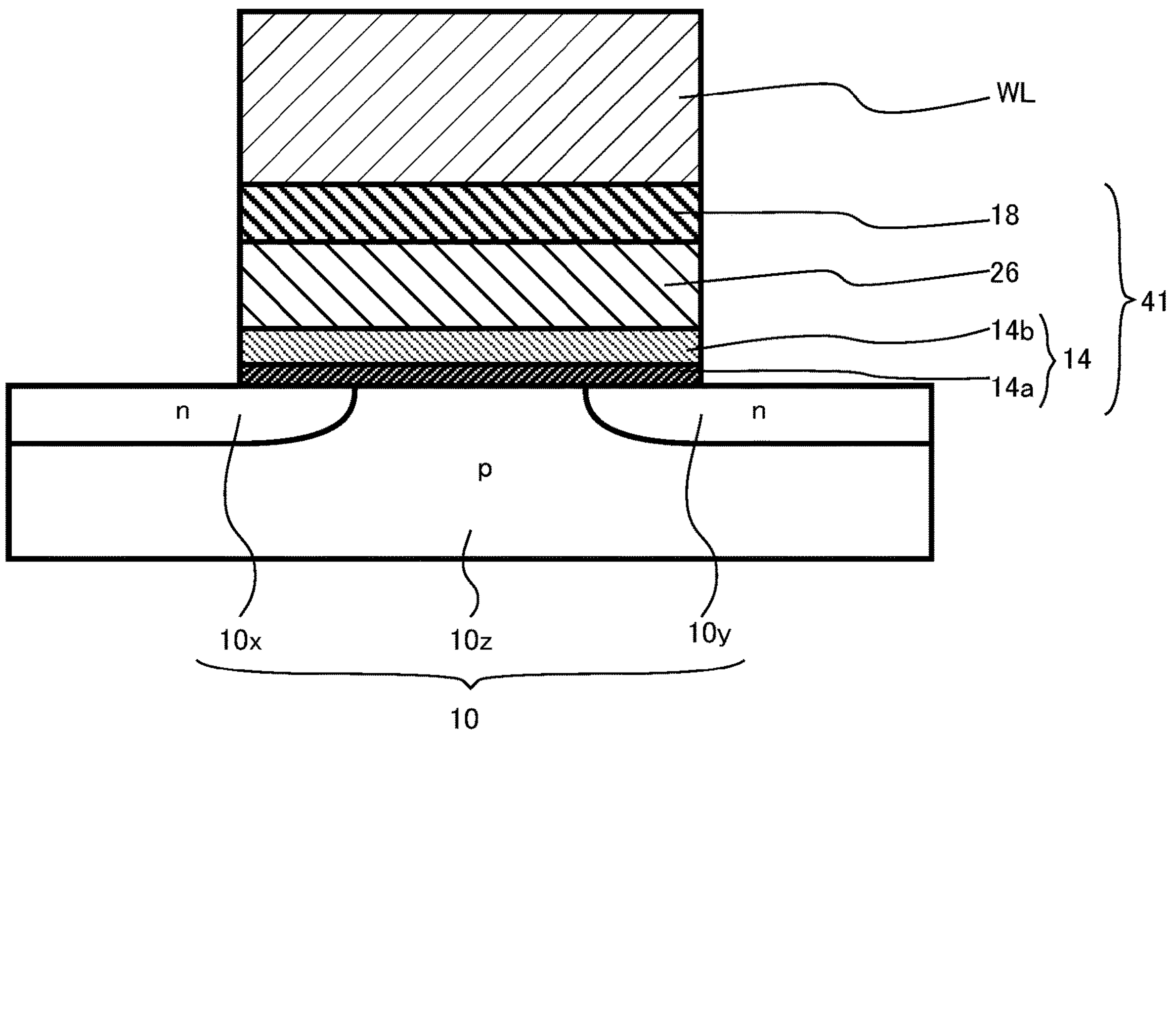
FIG. 15 is a schematic cross-sectional view of a memory cell of the semiconductor memory device according to the fifth embodiment.

FIG. 15 is a schematic cross-sectional view of a memory cell of the semiconductor memory device according to the fifth embodiment.

As shown in FIG. 15, the memory cell MC includes a semiconductor layer 10, a word line WL, and a gate insulating layer 41. The semiconductor layer 10 includes a source region 10*x*, a drain region 10*y*, and a channel region 10*z*. The gate insulating layer 41 includes a tunnel insulating layer 14, a charge storage layer 26, and a block insulating layer 18.

The word line WL is an example of a gate electrode layer. The tunnel insulating layer 14 is an example of the first insulating region. The block insulating layer 18 is an example of the second insulating region. The charge storage layer 26 is an example of a charge storage region.

The semiconductor layer 10 is, for example, single crystal silicon. The source region 10*x* and the drain region 10*y* are, for example, n-type semiconductors. The channel region 10*z* is, for example, a p-type semiconductor.

The source line SL is electrically connected to the source region 10*x*. The bit line BL is electrically connected to the drain region 10*y*.

The word line WL is a conductor. The word line WL is, for example, a metal.

The tunnel insulating layer 14 is provided between the semiconductor layer 10 and the word line WL. The tunnel insulating layer 14 is provided between the semiconductor layer 10 and the charge storage layer 26. The tunnel insulating layer 14 has a function of allowing charges to pass according to the voltage applied between the word line WL and the semiconductor layer 10.

The tunnel insulating layer 14 contains silicon (Si), nitrogen (N), and oxygen (O). The tunnel insulating layer 14 contains, for example, silicon oxynitride. The tunnel insulating layer 14 is, for example, a silicon oxynitride layer.

The tunnel insulating layer 14 may have a stacked structure of a plurality of films. As shown in FIG. 15, the tunnel insulating layer 14 has, for example, a stacked structure of a silicon oxide film 14*a* and a silicon oxynitride film 14*b*.

The charge storage layer 26 is provided between the tunnel insulating layer 14 and the block insulating layer 18.

The charge storage layer 26 has a function of storing charges. The charge is, for example, an electron. The threshold voltage of the memory cell transistor changes according to the amount of charges stored in the charge storage layer 26. By using the threshold voltage change, one memory cell can store data.

The charge storage layer 26 is a conductor. The charge storage layer 26 is, for example, polycrystalline silicon.

The block insulating layer 18 is provided between the tunnel insulating layer 14 and the word line WL. The block insulating layer 18 is provided between the charge storage layer 26 and the word line WL. The block insulating layer 18 has a function of blocking the current flowing between the charge storage layer 26 and the word line WL.

The block insulating layer 18 is an insulator. The block insulating layer 18 contains, for example, silicon (Si) and oxygen (O). The block insulating layer 18 contains, for example, silicon oxide. The block insulating layer 18 is, for example, a silicon oxide layer.

Figure 16:
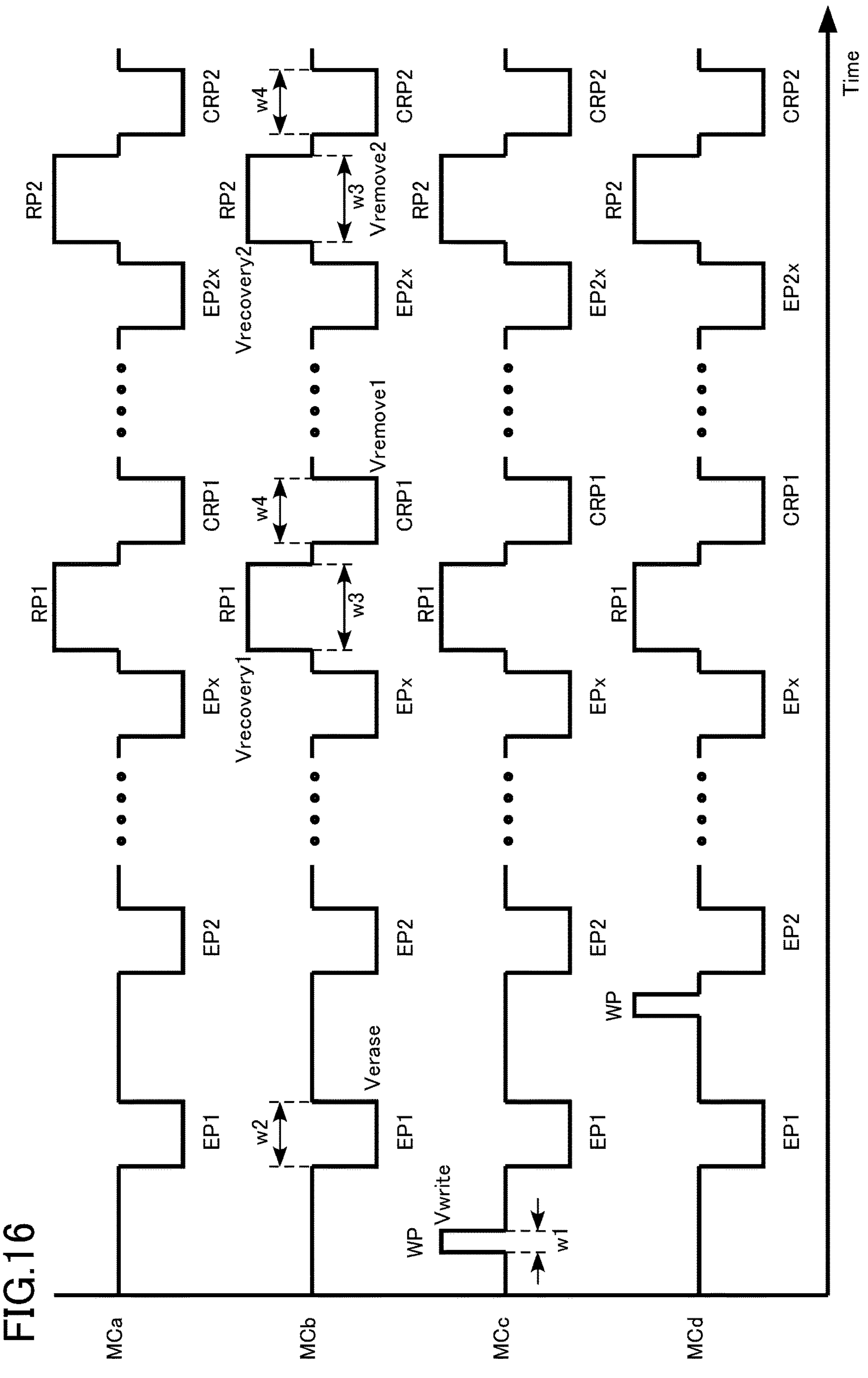
FIG. 16 is a timing chart illustrating the control of the semiconductor memory device according to the fifth embodiment.

FIG. 16 is a timing chart illustrating the control of the semiconductor memory device according to the fifth embodiment. FIG. 16 shows a voltage pulse applied to the gate insulating layer 11 of each of the memory cells MCa to MCd included in the memory cell array 410.

The peripheral circuit 420 of the two-dimensional NOR flash memory 400 and the controller 500 control, for example, a plurality of memory cells MC in the memory cell array 410. For example, the peripheral circuit 420 and the controller 500 control the memory cells MCa to MCd.

For example, the peripheral circuit 420 and the controller 500 can perform a data write operation on any one memory cell MC selected from the memory cells MCa to MCd.

FIG. 16 illustrates a case where a write operation is performed on the memory cell MCc and the memory cell MCd. In this case, for example, the memory cell MCc is an example of a memory cell. In this case, for example, the first source line SL1 is an example of the first wiring, and the first bit line BL1 is an example of the second wiring.

The write operation is, for example, to apply the write voltage pulse WP between the word line WL of any one memory cell MC and the source line SL or the bit line. The write operation is, for example, to apply the write voltage pulse WP between the word line WL of any one memory cell MC and the semiconductor layer 10. The write operation is, for example, to apply the write voltage pulse WP to the gate insulating layer of any one memory cell MC.

For example, the write voltage pulse WP is applied between the second word line WL2 of the memory cell MCc and at least one of the first source line SL1 and the first bit line BL1. In addition, for example, the write voltage pulse WP is applied between the second word line WL2 of the memory cell MCd and at least one of the second source line SL2 and the second bit line BL2.

The write voltage pulse WP has a write voltage Vwrite with a first polarity and a first pulse width w1.

The write voltage pulse WP is an example of the first voltage pulse. The write voltage Vwrite is an example of the first voltage.

In addition, the peripheral circuit 420 and the controller 500 can perform a data erase operation on any one memory cell MC selected from the memory cells MCa to MCd, for example. FIG. 16 illustrates a case where the erase operation is performed on the memory cells MCa to MCd at the same time.

The erase operation is, for example, to apply the erase voltage pulse EP between the word line WL of the memory cell MC and either the source line SL or the bit line. The erase operation is, for example, to apply the erase voltage pulse EP between the word line WL of the memory cell MC and the semiconductor layer 10. The erase operation is, for example, to apply the erase voltage pulse EP to the gate insulating layer of the memory cell MC.

The erase operation is, for example, to apply the erase voltage pulse EP between the first word line WL1 and at least one of the first source line SL1 and the first bit line BL1. In addition, for example, the erase voltage pulse EP is applied between the first word line WL1 and at least one of the second source line SL2 and the second bit line BL2. In addition, for example, the erase voltage pulse EP is applied between the second word line WL2 and at least one of the first source line SL1 and the first bit line BL1. In addition, for example, the erase voltage pulse EP is applied between the second word line WL2 and at least one of the second source line SL2 and the second bit line BL2.

The erase voltage pulse EP has an erase voltage Verase with a second polarity opposite to the first polarity and a second pulse width w2.

The erase voltage pulse EP is an example of the second voltage pulse. The erase voltage Verase is an example of the second voltage. In FIG. 16, an erase voltage pulse EP1, an erase voltage pulse EP2, an erase voltage pulse EPx, and an erase voltage pulse EP2x are examples of the second voltage pulse.

For example, it is also possible to select only the memory cell MCc and perform the erase operation.

In addition, in the erase operation, the erase voltage pulse EP can also be applied between the word line WL of the memory cell MC and the channel region 10*z* of the semiconductor layer 10 by using a wiring (not shown in FIG. 14) connected to the channel region 10*z*, for example. In this case, the wiring (not shown in FIG. 14) connected to the channel region 10*z* is an example of the first wiring or the second wiring.

In addition, the peripheral circuit 420 and the controller 500 can determine whether or not the number of times of execution of the erase operation on the memory cell MC has reached the first predetermined number of times. Specifically, the judgement circuit 511 of the controller 500 determines whether or not the number of times of execution of the erase operation on the memory cell MC has reached the predetermined number of times based on the number of times of execution of the erase operation stored in the built-in memory 520 and the first predetermined number of times for the erase operation stored in the built-in memory 520.

In addition, when it is determined that the number of times of execution of the erase operation has reached the first predetermined number of times, the peripheral circuit 420 and the controller 500 can perform a first recovery operation on the memory cell MC. The first recovery operation is an example of the first processing.

The first recovery operation is, for example, to apply the first recovery voltage pulse RP1 between the word line WL of the memory cell MC, for which the number of times of execution of the erase operation has reached the first predetermined number of times, and at least one of the source line SL and the bit line BL. The first recovery operation is, for example, to apply the first recovery voltage pulse RP1 between the semiconductor layer and the word line WL of the memory cell MC for which the number of times of execution of the erase operation has reached the first predetermined number of times. The first recovery operation is, for example, to apply the first recovery voltage pulse RP1 to the gate insulating layer of the memory cell MC for which the number of times of execution of the erase operation has reached the first predetermined number of times.

The first recovery operation is, for example, to apply the first recovery voltage pulse RP1 between the first word line WL1 and at least one of the first source line SL1 and the first bit line BL1. In addition, for example, the first recovery voltage pulse RP1 is applied between the first word line WL1 and at least one of the second source line SL2 and the second bit line BL2. In addition, for example, the first recovery voltage pulse RP1 is applied between the second word line WL2 and at least one of the first source line SL1 and the first bit line BL1. In addition, for example, the first recovery voltage pulse RP1 is applied between the second word line WL2 and at least one of the second source line SL2 and the second bit line BL2.

The first recovery voltage pulse RP1 has a first recovery voltage Vrecovery1 with a first polarity and an absolute value, which is equal to or more than the absolute value of the write voltage Vwrite, and a third pulse width w3 larger than the first pulse width w1.

The first recovery voltage Vrecovery1 is an example of the third voltage. The first recovery voltage pulse RP1 is an example of the third voltage pulse.

The third pulse width w3 is, for example, equal to or more than 10 msec and equal to or less than 1 sec. The third pulse width w3 is, for example, 10 times or greater than the first pulse width w1 and 1000 times or less than the first pulse width w1. The third pulse width w3 is, for example, larger than the second pulse width w2.

The absolute value of the first recovery voltage Vrecovery1 may be, for example, equal to or larger than the absolute value of the write voltage Vwrite.

The peripheral circuit 420 and the controller 500 can perform the first recovery operation, for example, immediately after the erase operation. For example, after the erase operation, the peripheral circuit 420 and the controller 500 can perform the first recovery operation without performing a write operation on any of the memory cells MC.

For example, when the number of times for the erase operation differs for each memory cell MC, it is also possible to select only the memory cell MC for which the number of times of execution of the erase operation has reached the first predetermined number of times and perform the erase operation.

In addition, the peripheral circuit 420 and the controller 500 can perform a first charge removing operation on the memory cell MC after the first recovery operation. The first charge removing operation is an example of the second processing.

The first charge removing operation is, for example, to apply the first charge removing voltage pulse CRP1 between the word line WL of the memory cell MC for which the first recovery operation has been performed and at least one of the source line SL and the bit line BL. The first charge removing operation is, for example, to apply the first charge removing voltage pulse CRP1 between the semiconductor layer 10 and the word line WL of the memory cell MC for which the first recovery operation has been performed. The first charge removing operation is, for example, to apply the first charge removing voltage pulse CRP1 to the gate insulating layer of the memory cell MC for which the first recovery operation has been performed.

The first charge removing operation is, for example, to apply the first charge removing voltage pulse CRP1 between the first word line WL1 and at least one of the first source line SL1 and the first bit line BL1. In addition, for example, the first charge removing voltage pulse CRP1 is applied between the first word line WL1 and at least one of the second source line SL2 and the second bit line BL2. In addition, for example, the first charge removing voltage pulse CRP1 is applied between the second word line WL2 and at least one of the first source line SL1 and the first bit line BL1. In addition, for example, the first charge removing voltage pulse CRP1 is applied between the second word line WL2 and at least one of the second source line SL2 and the second bit line BL2.

The first charge removing voltage pulse CRP1 has a first charge removing voltage Vremove1 with a second polarity and an absolute value, which is equal to or more than that of the erase voltage Verase, and a fourth pulse width w4.

The first charge removing voltage pulse CRP1 is an example of the fourth voltage pulse. The first charge removing voltage Vremove1 is an example of the fourth voltage.

The fourth pulse width w4 is, for example, larger than the second pulse width w2.

For example, immediately after the first recovery operation, the peripheral circuit 420 and the controller 500 can perform the first charge removing operation. For example, after the first recovery operation, the peripheral circuit 420 and the controller 500 can perform the first charge removing operation without performing a write operation on any of the memory cells MC.

In addition, after the first recovery operation, the peripheral circuit 420 and the controller 500 can determine whether or not the number of times of execution of the erase operation on the memory cell MC has reached the second predetermined number of times. Specifically, the judgement circuit 511 of the controller 500 determines whether or not the number of times of execution of the erase operation on the memory cell MC has reached the second predetermined number of times based on the number of times of execution of the erase operation stored in the built-in memory 520 and the second predetermined number of times for the erase operation stored in the built-in memory 520.

In addition, the peripheral circuit 420 and the controller 500 can perform a second recovery operation on the memory cell MC when it is determined that the number of times of execution of the erase operation has reached the second predetermined number of times.

The second recovery operation is, for example, to apply the second recovery voltage pulse RP2 between the word line WL of the memory cell MC, for which the number of times of execution of the erase operation has reached the second predetermined number of times, and at least one of the source line SL and the bit line BL. The second recovery operation is, for example, to apply the second recovery voltage pulse RP2 between the semiconductor layer and the word line WL of the memory cell MC for which the number of times of execution of the erase operation has reached the second predetermined number of times. The second recovery operation is, for example, to apply the second recovery voltage pulse RP2 to the gate insulating layer of the memory cell MC for which the number of times of execution of the erase operation has reached the second predetermined number of times.

The second recovery voltage pulse RP2 has a second recovery voltage Vrecovery2 with a first polarity and an absolute value, which is equal to or more than the absolute value of the write voltage Vwrite, and a third pulse width w3 larger than the first pulse width w1. For example, the second recovery voltage Vrecovery2 is equal to the first recovery voltage Vrecovery1.

In addition, the peripheral circuit 420 and the controller 500 can perform a second charge removing operation on the memory cell MC after the second recovery operation.

The second charge removing operation is, for example, to apply the second charge removing voltage Vremove2 between the word line WL of the memory cell MC for which the second recovery operation has been performed and at least one of the source line SL and the bit line BL. The second charge removing operation is, for example, to apply the second charge removing voltage Vremove2 between the semiconductor layer 10 and the word line WL of the memory cell MC for which the second recovery operation has been performed. The second charge removing operation is, for example, to apply the second charge removing voltage pulse CRP2 to the gate insulating layer of the memory cell MC for which the second recovery operation has been performed.

The second charge removing voltage pulse CRP2 has a second charge removing voltage Vremove2 with a second polarity and an absolute value, which is equal to or more than that of the erase voltage Verase, and a fourth pulse width w4. For example, the second charge removing voltage Vremove2 is equal to the first charge removing voltage Vremove1.

A case is considered in which the voltage applied to the gate electrode layer is a negative voltage during an erase operation on a memory cell. As the erase operation on the memory cell is repeated, the threshold voltage of the memory cell transistor after the erase operation changes to the negative side. In other words, the threshold voltage of the memory cell transistor after the erase operation is reduced.

In the two-dimensional NOR flash memory, when the threshold voltage of the memory cell transistor decreases, the leakage current of the memory cell transistor increases. When the leakage current of the memory cell transistor increases, for example, the power consumption of the two-dimensional NOR flash memory increases. In addition, for example, an increase in the leakage current of an unselected memory cell may cause a malfunction in reading data from the selected memory cell. Thus, fluctuations in the threshold voltage of the memory cell transistor reduce the reliability of the two-dimensional NOR flash memory.

The semiconductor memory device according to the fifth embodiment includes a control circuit that can perform a first recovery operation on the memory cell MC. After the erase operation on the memory cell MC is performed the first predetermined number of times, the first recovery operation is performed to reduce the trap level generated in the tunnel insulating layer 14 containing silicon (Si), nitrogen (N), and oxygen (O).

By reducing the trap level generated in the tunnel insulating layer 14, the amount of holes trapped in the tunnel insulating layer 14 after the erase operation is reduced. Therefore, a decrease in the threshold voltage of the memory cell transistor after the erase operation can be suppressed. As a result, the reliability of the two-dimensional NOR flash memory is improved.

As described above, according to the fifth embodiment, due to the same function as in the first embodiment, fluctuations in the threshold voltage of the memory cell transistor are suppressed, so that it is possible to realize a highly reliable semiconductor memory device.

In addition, although the structure in which the semiconductor layer 10 is surrounded by the word line WL has been described as an example in the first to fourth embodiments, it is also possible to have a structure in which the semiconductor layer 10 is interposed between the two divided word lines WL. In the case of this structure, the number of memory cells in the stacked body 30 can be doubled.

In addition, although the structure in which one semiconductor layer 10 is provided in one memory hole has been described as an example in the first to fourth embodiments, it is also possible to adopt a structure in which a plurality of semiconductor layers 10, which are two or more divided semiconductor layers, are provided in one memory hole. In the case of this structure, the number of memory cells in the stacked body 30 can be doubled or more.

In addition, although the NAND flash memory having a three-dimensional structure has been described as an example in the first to third embodiments, the NAND flash memory may have a two-dimensional structure.

In addition, a three-dimensional NAND flash memory has been described as an example in the first to third embodiments, a ferroelectric memory has been described as an example in the fourth embodiment, and a two-dimensional NOR flash memory has been described as an example in the fifth embodiment. However, embodiments can also be applied to other semiconductor memory devices in which a field effect transistor containing silicon (Si), nitrogen (N), and oxygen (O) in its gate insulating layer is used as a memory cell.

In addition, in the first to fifth embodiments, the case where the first polarity is a polarity in which the word line WL has a positive voltage with respect to the semiconductor layer 10 and the second polarity is a polarity in which the word line WL has a negative voltage with respect to the semiconductor layer 10 has been described as an example. However, it is also possible to set the first polarity to a polarity in which the word line WL has a negative voltage with respect to the semiconductor layer 10 and set the second polarity to a polarity in which the word line WL has a positive voltage with respect to the semiconductor layer 10.

While certain embodiments have been described, these embodiments have been presented by way of example only, and are not intended to limit the scope of the inventions. Indeed, the semiconductor memory device and the method for controlling a semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor memory device, comprising:

a memory cell array including:

a first semiconductor layer extending in a first direction;

a plurality of gate electrode layers stacked in the first direction;

a first wiring electrically connected to one end of the first semiconductor layer;

a second wiring electrically connected to the other end of the first semiconductor layer; and a plurality of first memory cells, each of the plurality of first memory cells including a part of the first semiconductor layer, one of the plurality of gate electrode layers, and a gate insulating layer including a first insulating region containing silicon (Si), oxygen (O), and nitrogen (N) and provided between the part of the first semiconductor layer and the one of the plurality of gate electrode layers; and a control circuit configured to control the plurality of first memory cells, wherein the control circuit is configured to perform a write operation on one first memory cell selected from the plurality of first memory cells, and in the write operation configured to apply a first voltage pulse having a first voltage with a first polarity and a first pulse width between the one of the plurality of gate electrode layers of the one first memory cell and at least one of the first wiring or the second wiring, the control circuit is configured to perform an erase operation on the plurality of first memory cells, and in the erase operation configured to apply a second voltage pulse having a second voltage with a second polarity opposite to the first polarity and a second pulse width between each of the gate electrode layers of the plurality of first memory cells and at least one of the first wiring or the second wiring, the control circuit is configured to determine whether or not the number of times of execution of the erase operation on the plurality of first memory cells has reached a first predetermined number of times, the control circuit is configured to perform first processing on the plurality of first memory cells when it is determined that the number of times of execution has reached the first predetermined number of times, and in the first processing configured to apply a third voltage pulse having a third voltage with the first polarity and an absolute value equal to or more than an absolute value of the first voltage and a third pulse width larger than the first pulse width between each of the gate electrode layers of the plurality of first memory cells and at least one of the first wiring or the second wiring, the control circuit is configured to perform second processing on the plurality of first memory cells after the first processing, and in the second processing configured to apply a fourth voltage pulse having a fourth voltage with the second polarity and an absolute value equal to or more than an absolute value of the second voltage and a fourth pulse width between each of the gate electrode layers of the plurality of first memory cells and at least one of the first wiring or the second wiring, the gate insulating layer further includes a second insulating region between the first insulating region and the one of the plurality of gate electrode layers and a charge storage region between the first insulating region and the second insulating region, the charge storage region is configured to trap and store charges, a threshold voltage of a transistor of each of the plurality of first memory cells changes according to an amount of charges stored in the charge storage region, and each of the plurality of first memory cells is configured to store data based on the threshold voltage, the first insulating region includes silicon oxynitride, the charge storage region includes silicon nitride, and the second insulating region includes silicon oxide or aluminum oxide, the second pulse width is larger than the first pulse width, the third pulse width is larger than the second pulse width, and the third pulse width is larger than the fourth pulse width.

2. The semiconductor memory device according to claim 1, wherein the third pulse width is equal to or more than 10 msec and equal to or less than 1 sec.

3. The semiconductor memory device according to claim 1, wherein the third pulse width is 10 times or greater than the first pulse width.

4. The semiconductor memory device according to claim 1, wherein the fourth pulse width is larger than the second pulse width.

5. The semiconductor memory device according to claim 1, wherein the absolute value of the third voltage is larger than the absolute value of the first voltage.

6. The semiconductor memory device according to claim 1, wherein the first polarity is a polarity causing the one of the plurality of gate electrode layers to have a positive voltage with respect to at least one of the first wiring or the second wiring, and the second polarity is a polarity causing the one of the plurality of gate electrode layers to have a negative voltage with respect to at least one of the first wiring or the second wiring.

7. The semiconductor memory device according to claim 1, wherein the control circuit is configured to perform the second processing without performing the write operation between the first processing and the second processing.

8. The semiconductor memory device according to claim 1, wherein the control circuit is configured to perform the first processing without performing the write operation between the erase operation and the first processing.

9. The semiconductor memory device according to claim 1, wherein the memory cell array further includes:

a second semiconductor layer extending in the first direction, one end of the second semiconductor layer connected to the first wiring;

a third wiring connected to the other end of the second semiconductor layer; and a plurality of second memory cells, each of the plurality of second memory cells including a part of the second semiconductor layer, one of the plurality of gate electrode layers, and a gate insulating layer including a third insulating region containing silicon (Si), oxygen (O), and nitrogen (N) and provided between the part of the second semiconductor layer and the one of the plurality of gate electrode layers, the control circuit is further configured to control the plurality of second memory cells, and the control circuit is configured to perform a write operation on one second memory cell selected from the plurality of second memory cells, and in the write operation configured to apply the first voltage pulse between the one of the plurality of gate electrode layers of the one second memory cell and at least one of the first wiring or the third wiring, in the erase operation configured to apply the second voltage pulse between each of the gate electrode layers of the plurality of second memory cells and at least one of the first wiring or the third wiring, in the first processing configured to apply the third voltage pulse between each of the gate electrode layers of the plurality of second memory cells and at least one of the first wiring or the third wiring, and in the second processing configured to apply the fourth voltage pulse between each of the gate electrode layers of the plurality of second memory cells and at least one of the first wiring or the third wiring.

10. The semiconductor memory device according to claim 1, wherein the control circuit is configured to determine whether or not the number of times of execution of the erase operation on the plurality of first memory cells after the second processing has reached a second predetermined number of times, the control circuit is configured to perform third processing on the plurality of first memory cells when it is determined that the number of times of execution has reached the second predetermined number of times, and in the third processing configured to apply a fifth voltage pulse having a fifth voltage with the first polarity and an absolute value equal to or more than the absolute value of the first voltage and a fifth pulse width larger than the third pulse width between each of the gate electrode layers of the plurality of first memory cells and at least one of the first wiring or the second wiring, and the control circuit is configured to perform fourth processing on the plurality of first memory cells after the third processing, and in the fourth processing configured to apply a sixth voltage pulse having a sixth voltage with the second polarity and an absolute value equal to or more than the absolute value of the second voltage and a sixth pulse width between each of the gate electrode layers of the plurality of first memory cells and at least one of the first wiring or the second wiring.

11. The semiconductor memory device according to claim 10, wherein the sixth pulse width is larger than the fourth pulse width.

12. The semiconductor memory device according to claim 1, wherein, in the first processing, an application of the third voltage pulse between each of the gate electrode layers of the plurality of first memory cells and at least one of the first wiring or the second wiring is performed simultaneously for the plurality of first memory cells.

13. The semiconductor memory device according to claim 1, wherein, in the first processing, an application of the third voltage pulse between each of the gate electrode layers of the plurality of first memory cells and at least one of the first wiring or the second wiring is performed for each group obtained by dividing the plurality of first memory cells into a plurality of groups.

14. The semiconductor memory device according to claim 1, wherein the first insulating region is in direct contact with the part of the first semiconductor layer, the charge storage region is in direct contact with the first insulating region, the second insulating region is in direct contact with the charge storage region, and the one of the plurality of gate electrode layers is in direct contact with the second insulating region.

15. A semiconductor memory device, comprising:

a memory cell including a semiconductor layer, a gate electrode layer, and a gate insulating layer including a first insulating region containing silicon (Si), oxygen (O), and nitrogen (N) and provided between the semiconductor layer and the gate electrode layer;

a first wiring and a second wiring electrically connected to the semiconductor layer; and a control circuit configured to control the memory cell, wherein the control circuit is configured to perform a write operation on the memory cell, and in the write operation configured to apply a first voltage pulse having a first voltage with a first polarity and a first pulse width between the gate electrode layer and at least one of the first wiring or the second wiring, the control circuit is configured to perform an erase operation on the memory cell, and in the erase operation configured to apply a second voltage pulse having a second voltage with a second polarity opposite to the first polarity and a second pulse width between the gate electrode layer and at least one of the first wiring or the second wiring, the control circuit is configured to determine whether or not the number of times of execution of the erase operation on the memory cell has reached a predetermined number of times, the control circuit is configured to perform first processing on the memory cell when it is determined that the number of times of execution has reached the predetermined number of times, and in the first processing configured to apply a third voltage pulse having a third voltage with the first polarity and an absolute value equal to or more than an absolute value of the first voltage and a third pulse width larger than the first pulse width between the gate electrode layer and at least one of the first wiring or the second wiring, the control circuit is configured to perform second processing on the memory cell after the first processing, and in the second processing configured to apply a fourth voltage pulse having a fourth voltage with the second polarity and an absolute value equal to or more than an absolute value of the second voltage and a fourth pulse width between the gate electrode layer and at least one of the first wiring or the second wiring, the gate insulating layer further includes a second insulating region between the first insulating region and the gate electrode layer and a charge storage region between the first insulating region and the second insulating region, the charge storage region is configured to trap and store charges, a threshold voltage of a transistor of the memory cell changes according to an amount of charges stored in the charge storage region, and the memory cell is configured to store data based on the threshold voltage, the first insulating region includes silicon oxynitride, the charge storage region includes silicon nitride, and the second insulating region includes silicon oxide or aluminum oxide, the second pulse width is larger than the first pulse width, the third pulse width is larger than the second pulse width, and the third pulse width is larger than the fourth pulse width.

16. The semiconductor memory device according to claim 15, wherein the third pulse width is equal to or more than 10 msec and equal to or less than 1 sec.

17. The semiconductor memory device according to claim 15, wherein the third pulse width is 10 times or greater than the first pulse width.

18. The semiconductor memory device according to claim 15, wherein the fourth pulse width is larger than the second pulse width.

19. The semiconductor memory device according to claim 15, wherein the absolute value of the third voltage is larger than the absolute value of the first voltage.

20. The semiconductor memory device according to claim 15, wherein the first insulating region is in direct contact with the semiconductor layer, the charge storage region is in direct contact with the first insulating region, the second insulating region is in direct contact with the charge storage region, and the gate electrode layer is in direct contact with the second insulating region.

21. A method for controlling a semiconductor memory device including a memory cell array including a first semiconductor layer extending in a first direction, a plurality of gate electrode layers stacked in the first direction, a first wiring electrically connected to one end of the first semiconductor layer, a second wiring electrically connected to the other end of the first semiconductor layer, and a plurality of first memory cells, each of the plurality of first memory cells including a part of the first semiconductor layer, one of the plurality of gate electrode layers, and a gate insulating layer including a first insulating region containing silicon (Si), oxygen (O), and nitrogen (N) and provided between the part of the first semiconductor layer and the one of the plurality of gate electrode layers, the method comprising:

performing a write operation on one first memory cell selected from the plurality of first memory cells, in the write operation applying a first voltage pulse having a first voltage with a first polarity and a first pulse width between the one of the plurality of gate electrode layers of the one first memory cell and at least one of the first wiring or the second wiring;

performing an erase operation on the plurality of first memory cells, in the erase operation applying a second voltage pulse having a second voltage with a second polarity opposite to the first polarity and a second pulse width between each of the gate electrode layers of the plurality of first memory cells and at least one of the first wiring or the second wiring;

determining whether or not the number of times of execution of the erase operation has reached a predetermined number of times;

performing first processing on the plurality of first memory cells when it is determined that the number of times of execution has reached the predetermined number of times, in the first processing applying a third voltage pulse having a third voltage with the first polarity and an absolute value equal to or more than an absolute value of the first voltage and a third pulse width larger than the first pulse width between each of the gate electrode layers of the plurality of first memory cells and at least one of the first wiring or the second wiring; and performing second processing on the plurality of first memory cells after the first processing, in the second processing applying a fourth voltage pulse having a fourth voltage with the second polarity and an absolute value equal to or more than an absolute value of the second voltage and a fourth pulse width between each of the gate electrode layers of the plurality of first memory cells and at least one of the first wiring or the second wiring, wherein the gate insulating layer further includes a second insulating region between the first insulating region and the one of the plurality of gate electrode layers and a charge storage region between the first insulating region and the second insulating region, the charge storage region is configured to trap and store charges, a threshold voltage of a transistor of each of the plurality of first memory cells changes according to an amount of charges stored in the charge storage region, and each of the plurality of first memory cells is configured to store data based on the threshold voltage, the first insulating region includes silicon oxynitride, the charge storage region includes silicon nitride, and the second insulating region includes silicon oxide or aluminum oxide, the second pulse width is larger than the first pulse width, the third pulse width is larger than the second pulse width, and the third pulse width is larger than the fourth pulse width.

22. The method for controlling a semiconductor memory device according to claim 21, wherein, in the first processing, an application of the third voltage pulse between each of the gate electrode layers of the plurality of first memory cells and at least one of the first wiring or the second wiring is performed simultaneously for the plurality of first memory cells.

23. The method for controlling a semiconductor memory device according to claim 22, wherein, in the first processing, an application of the third voltage pulse between each of the gate electrode layers of the plurality of first memory cells and at least one of the first wiring or the second wiring is performed for each group obtained by dividing the plurality of first memory cells into a plurality of groups.

24. The method for controlling a semiconductor memory device according to claim 23, wherein the first insulating region is in direct contact with the part of the first semiconductor layer, the charge storage region is in direct contact with the first insulating region, the second insulating region is in direct contact with the charge storage region, and the one of the plurality of gate electrode layers is in direct contact with the second insulating region.

* * * * *